United States Patent
Alhubail et al.

(10) Patent No.: US 11,354,469 B2
(45) Date of Patent: Jun. 7, 2022

(54) PARALLEL PROCESSOR DATA PROCESSING SYSTEM WITH REDUCED LATENCY

(71) Applicants: SAUDI ARABIAN OIL COMPANY, Dhahran (SA); MASSACHUSETTS INSTITUTE OF TECHNOLOGY, Cambridge, MA (US)

(72) Inventors: Maitham Makki Alhubail, Cambridge, MA (US); John R Williams, Cambridge, MA (US); Qiqi Wang, Cambridge, MA (US); Ali Dogru, Dhahran (SA); Usuf Middya, Dhahran (SA)

(73) Assignees: Saudi Arabian Oil Company, Dhahran (SA); Massachusetts Institute of Technology, Cambridge, MA (US)

( * ) Notice: Subject to any disclaimer, the term of this patent is extended or adjusted under 35 U.S.C. 154(b) by 211 days.

(21) Appl. No.: 16/695,504

(22) Filed: Nov. 26, 2019

(65) Prior Publication Data
US 2020/0175217 A1  Jun. 4, 2020

Related U.S. Application Data

(60) Provisional application No. 62/773,373, filed on Nov. 30, 2018.

(51) Int. Cl.
 G06F 30/28  (2020.01)
 G06F 9/38   (2018.01)
 G06F 17/13  (2006.01)
 G01V 99/00  (2009.01)
 G01N 25/18  (2006.01)

(52) U.S. Cl.
 CPC ............ G06F 30/28 (2020.01); G01N 25/18 (2013.01); G01V 99/005 (2013.01); G06F 9/3885 (2013.01); G06F 17/13 (2013.01)

(58) Field of Classification Search
 CPC ........ G06F 30/28; G06F 9/3885; G06F 17/13; G06F 30/23; G06F 30/20; G06F 9/546; G06F 30/25; G06F 30/367; G06F 30/398; G06F 2111/00; G06F 2119/22; G01V 99/005; G01N 25/18
 See application file for complete search history.

(56) References Cited

U.S. PATENT DOCUMENTS

2012/0316792 A1  12/2012  Liu et al.
2012/0316850 A1  12/2012  Liu et al.

OTHER PUBLICATIONS

Thomas Steel Henretty, "Performance Optimization of Stencil Computations on Modern SIMD Architectures," Dissertation The Ohio State University, pp. 1-176 (Year: 2014).*

(Continued)

Primary Examiner — Steven W Crabb
(74) Attorney, Agent, or Firm — Bracewell LLP; Constance G. Rhebergen; Brian H. Tompkins

(57) ABSTRACT

A data processing system systems with parallel processors performing simulations by numerical solution of partial differential equations or similar numerical simulations. The data processing system extends the scaling limit of parallel solvers in those numerical simulations by overcoming the frequent network latencies encountered during a simulation. Fewer, yet larger batches of data are exchanged between computing nodes.

6 Claims, 14 Drawing Sheets

(56) References Cited

OTHER PUBLICATIONS

Daniel A. Reed, et al., "Stencils and Problem Partitionings: Their Influence on the Performance of Multiple Processor Systems," IP.com Electronic Publication (Year: 2007).*

Alhubail, M., The Swept Rule for Breaking the Latency Barrier in Time Avancing Pds, JCP 307 pp. 110-121 (2016) doi:10.1016/j.jcp.2015.11.026.

Ballard, G., Minimizing Communication in Numerical Linear Algebra, SIAM J. Matrix Anal. & Appl., vol. 32, No. 3, pp. 866-901; Society for Industrial and Applied Mathematics.

Bertolacci, I., Parameterized Diamond Tiling for Stencil Computations with Chapel Parallel Iterators, URL http://www.cs.colostate.edu/-ibertola/publications/ICS2015-Paper Parameterized_Diamond_Tiling_for_Stencil_Computations_with_Chapel_Parallel_.

Emmett, M., Toward an Efficient Parallel in Time Method for Partial Differential Equations, Communications in Applied Mathematics and Computation Science 7, pp. 105-132, 2012, doi:10.2140/camcos.2012.7.105.

Falgout, R., Parallel Time Integration with Multigrid, PAMM 14, doi:10.1002/pamm.201410456.

Gander, M., Multiple Shooting and Time Domain Decomposition Methods, Years of Time Parallel Time Integration, Chapter 50, pp. 69-113, Springer International Publishing, Switzerland, 2015, doi:10.1007/978-3-319-23321-5_3.

Khabou, A., Lu Factorization with Panel Rank Revealing Pivoting and it Communication Avoiding Version, SIAM J. Matrix Anal. & Appl., vol. 34, No. 3, pp. 1401-1429, Society for Industrial and Applied Mathematics, 2013.

Lions, J., A Parareal in Time Discretization of Pdes, Comptes Rendus Mathematique 332, pp. 661-668, (2001, doi:10.1016/S0764-4442(00)01793-6.

Malas, T., Multicore-optimized Wavefront Diamond Blocking for Optimizing Stencil Updates, URL http://arvix.org/pdf/1410.3060v.1.pdf.

Rao, V., An adjoint-based Scalable Algorithm for Time-parallel Interation, Journal of Computation Science 5, pp. 76-84, 2014, doi:10.1016/j.jocs.2013.13.004.

Tang, Y., The Pochoir Stencil Compiler (2011) pp. 117-128, doi:10.1145/1989493.1989508.

Wang, Q., Towards Scalable Parallel-in-time Turbulent Flow Simulation, Physics of Fluids 25 (11) (2013) 110818, 1994-present.

Anonymous, "Nagle's Algorithm", Wikipedia, 2018, pp. 4.

International Search Report and Written Opinion for related PCT application PCT/IB2019/060190 dated Feb. 26, 2020.

* cited by examiner

| SPACE-TIME COMPONENT | | X-AXIS | Y-AXIS | Z-AXIS |
|---|---|---|---|---|
| SHRINKING CUBE | STEP 202 | ↘ | ↘ | ↘ |
| COMMUNICATE | | — | — | — |
| LONGITUDINAL BEAM | STEP 206 | ↗ | ↘ | ↘ |
| LATITUDINAL BEAM | | ↘ | ↗ | ↘ |
| ALTITUDINAL BEAM | | ↘ | ↘ | ↗ |
| COMMUNICATE | | — | — | — |
| LONGITUDINAL CORE | STEP 210 | ↘ | ↗ | ↗ |
| LATITUDINAL CORE | | ↗ | ↘ | ↗ |
| ALTITUDINAL CORE | | ↗ | ↗ | ↘ |
| COMMUNICATE | | — | — | — |
| GROWING CUBE | STEP 214 | ↗ | ↗ | ↗ |

FIG. 3

PARALLEL PROCESSOR DATA PROCESSING SYSTEM WITH REDUCED LATENCY

This application claims priority to commonly-owned U.S. Provisional Patent Application Ser. No. 62/773,373, titled "PARALLEL PROCESSOR DATA PROCESSING SYSTEM WITH REDUCED LATENCY," filed Nov. 30, 2018.

BACKGROUND OF THE INVENTION

1. Field of the Invention

The present invention relates to data processing systems with parallel processors operating with improved performance from reduced latency during determination of physical conditions of a complex technical character, and in solving technological problems. The data processing systems operate by performing simulations by numerical solution of partial differential equations and other complex numerical simulations.

2. Description of the Related Art

A number of technologies involve a technological or technical problem governed by complex physical relationships. Examples include heat diffusion relationships involved in design and construction of turbine blades, fluid production from subsurface hydrocarbon reservoirs, and travel of mechanical wave energy through a three-dimensional subsurface region during seismic exploration. The performance and interrelation of the measures and conditions involved in these #6101199.1 technologies are governed by partial differential equations (PDE's). Similar situations exist when the performance and interrelation of the measures and conditions can be solved in computers using what are known as iterative linear solvers. The strong demand to determine these results by numerical solution in a less time-consuming manner by using more parallel processors is currently unmet for small and long unsteady simulations. A simulation is considered small if the PDE is discretized spatially on a few (two or more) million grid points. Also, a simulation is considered long if the PDE needs to be time integrated for millions of time steps. Small and long simulations arise from many technological processes and physical relationships, as well as scientific researches. Small and long simulations are encountered in many industries.

Heat diffusion, wave equations and linear systems that arise from reservoir simulation are examples of technological processes and physical relationships which involve simulating by numerical solution with parallel processors. In aero-thermal design of turbomachinery components, for example, with small and long simulations has been used in the design of trailing edges of turbine blades. The computer processing time required for solution of these simulations of the various types mentioned often becomes a bottleneck against new product development and technological innovation. These simulations are difficult to parallelize, and even more difficult to scale to many parallel processors.

Scaling of a parallel PDE solver or numerical solver is always limited, as the computing nodes need to communicate and exchange data with each other. Communication is required because data values at the discretized grid points in each of the processor nodes at each of the time steps has an effect on certain of the data values and processing of adjacent grid points being processed in the processor node. Further, certain of the discretized grid points are adjacent to grid points being processed in other processor nodes.

The need for communication between processor nodes in parallel processing occurs more frequently as the parallel PDE solver is deployed into more nodes. This causes any potential PDE solver speed-up to diminish. Further, adding more processors no longer reduces the run time. The limit after which no reduction in run time is gained is known as the scaling limit and is inevitably encountered as a parallel PDE solver is deployed into more nodes. In most cases, the scaling limit of a parallel PDE solver is that time needed to communicate between the computing nodes. The time it takes to send and receive data between the computing nodes is called the network latency. The communication time between nodes is a fundamental cause of the scaling limit.

SUMMARY OF THE INVENTION

Briefly, the present invention provides a new and improved data processing system with parallel processors performing simulations by numerical solution of partial differential equations or simulations of comparable complexity and time duration. The data processing system extends the scaling limit of the parallel processor solvers by overcoming the frequent network latencies encountered during the numerical simulation. It achieves this by exchanging fewer, yet larger batches of data between computing nodes. The data processing system continually assembles within the processor nodes the data that needs to be communicated until it is absolutely necessary to communicate with other nodes in order to perform further computations for the simulation. When communication between processor nodes becomes necessary, the assembled data is communicated at once as a large batch instead of several smaller batches of data.

BRIEF DESCRIPTION OF THE DRAWINGS

The present application contains drawings executed in color. It is submitted that the color drawings are necessary to gain a more thorough understanding of the advantages and benefits of the present invention. As disclosed in the above-referenced application, the present invention relates to data processing systems with parallel processors operating with improved performance from reduced latency during determination of physical conditions of a complex technical character, and in solving technological problems. The color drawings obtained are important in illustrating how this reduced latency is obtained. Applicants submit that the enclosed color figures submitted with the application are the only practicable medium for illustrating these features of the claimed embodiments of the invention.

FIG. 3 is a schematic diagram of the functionality of operation of the data processing system of FIG. 1 performing simulations by numerical solution according to the present invention.

DETAILED DESCRIPTION OF THE PREFERRED EMBODIMENTS

Figure 1:
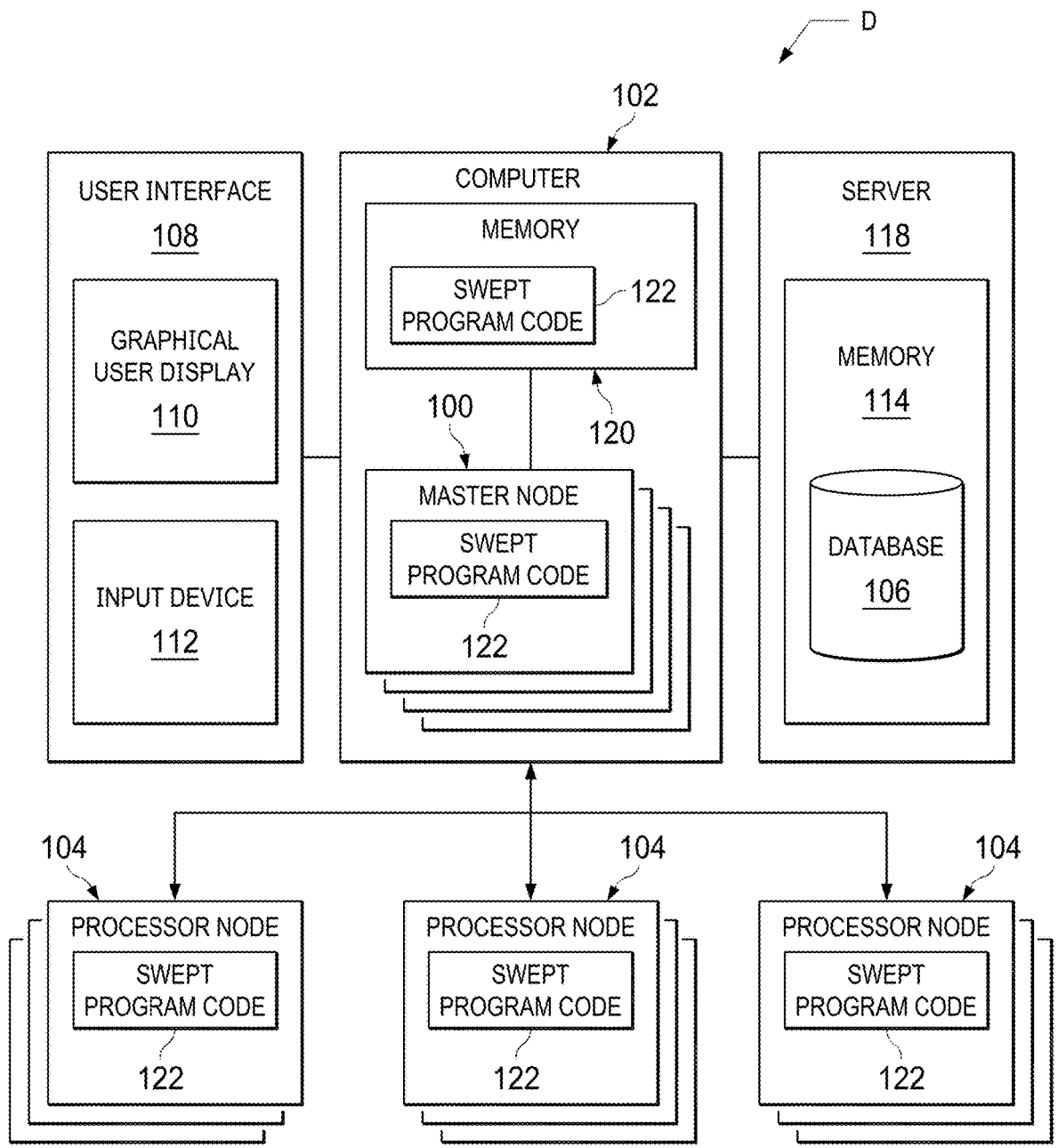
FIG. 1 is a schematic diagram of a data processing system with parallel processors performing simulations by numerical solution according to the present invention.

With the present invention, as is shown schematically in FIG. 1 a data processing system D according to the present invention includes a plurality of master nodes 100 of a CPU 102 and a group of processor or worker nodes 104 operating as a network arranged for performing a simultaneous numerical simulation such as technological and physical relationships governed by partial differential equations.

The data processing system D is provided as a processing platform for high performance computing (HPC) of unsteady simulations. The data processing system D includes one or more central processing units or CPU's 102. The CPU or CPU's 102 have associated therewith a memory or database 106 for general input parameters, of a type and nature according to the numerical simulation being performed. This database for example stores an initial condition of the simulation be performed. In a reservoir simulation, an initial condition includes the pressure distribution, wells data, oil saturation data. In heat diffusion simulations, the initial heat sources and body material types are provided.

A user interface 108 operably connected with the CPU 102 includes a graphical display 110 for displaying graphical images, a printer or other suitable image forming mechanism and a user input device 112 to provide a user access to manipulate, access and provide output forms of processing results, database records and other information.

The memory or database 106 is typically in a memory 114 of an external data storage server or computer 118. The database 106 contains data including the structure, location and organization of the cells in the numerical simulation being performed, data general input parameters, as well as the data to be processed by data processing system D for the numerical simulation, as is described below.

The CPU or computer 102 of data processing system D includes the master nodes 100 and an internal memory 120 coupled to the master nodes 100 to store operating instructions, control information and to serve as storage or transfer buffers as required. The data processing system D includes program code 122 stored in memory 120. The program code 122, according to the present invention, is in the form of computer operable instructions causing the data processing system D to perform the required numerical simulation. The program code 122 is also stored, as indicated in FIG. 1 in each of the master nodes 100 and in the parallel processor nodes 124. The program code 122 causes the master nodes 100 and processor nodes 104 to transfer the numerical simulation data and control instructions back and forth between each other according to during the numerical suit simulation being performed.

It should be noted that program code 122 may be in the form of microcode, programs, routines, or symbolic computer operable languages that provide a specific set of ordered operations that control the functioning of the data processing system D and direct its operation. Table 1 through Table 9 presented in subsequent portions of the present application are an embodiment of such instructions, written in pseudo code and can be implemented in any modern computer programming language. For validation purposes of the presented invention, a fully functional prototype was written in C++ programming language.

The processor nodes 104 are general purpose, programmable data processing units programmed to perform the processing of exploration and production data according to the present invention. The processor nodes 104 operate under control of the master node(s) 100 and the processing results obtained are then assembled in memory 114 where the data are provided for formation with user interface 108 of output displays to form data records for analysis and interpretation.

Although the present invention is independent of the specific computer hardware used, an example embodiment of the present invention is preferably based on master nodes 100 and processor nodes 104 of a cloud based or high network latency cluster computer. It should be understood, however, that other computer hardware may also be used, and that the present invention is effective even in computer clusters with equipped with a number of types of recently developed computer networking hardware.

Network latency, not bandwidth or computing power, often limits how quickly complex physical relationships governed by partial differential equations (PDE's), or which are solved in computers using linear solvers can be solved by parallel processing. The present invention provides a new and improved methodology to improve computer performance and accelerate parallel time integration of unsteady PDE's and other numerical simulations. The methodology is called the swept rule of space-time domain decomposition. When decomposing the computational domain of a PDE between compute nodes in a computer cluster, the swept rule considers the time as an additional dimension. Compared to existing, space-only domain decomposition, the swept rule communicates similar amount of data, but in less frequent, yet larger messages.

Figure 2:
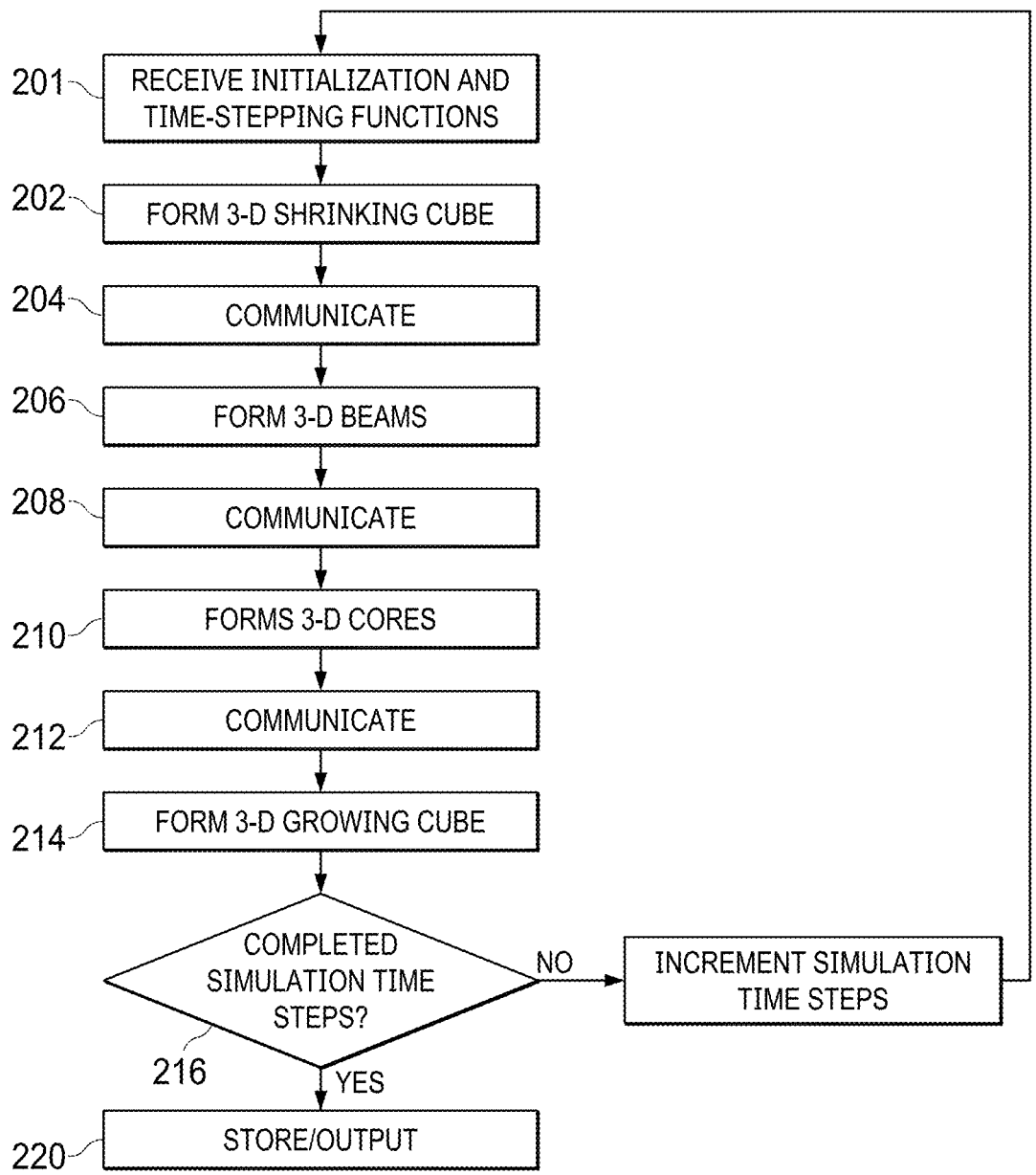
FIG. 2 is a functional block diagram of work flow or operation of the data processing system with parallel processors of FIG. 1 performing simulations by numerical solution according to the present invention.

FIG. 2 is a functional block diagram of a set 200 of data processing steps performed by the master node(s) 100 and in the data processing system D according to the present invention. The data processing system D operating according to the present invention under control of processing steps set 200 improves computer performance and accelerate parallel time integration of unsteady PDE's and other numerical simulations. This is accomplished without incurring any redundant computation by decomposing space and time among computing nodes in ways that exploit the domains of influence and the domain of dependency, making it possible to communicate once per many time steps. By communicating less frequently, the data processing system D breaks the latency barrier, advancing on average more than one time step per round-trip latency of the parallel process computer network.

The present invention extends the scaling limit of parallel PDE solvers by overcoming the frequent network latencies encountered during a numerical simulation of complex physical relationships for which the performance and interrelation of the measures and conditions of the time described above.

The present invention thus improves computer functionality of parallel processor computer networks by reducing network latency. The present invention is particularly adapted to perform simulations by numerical solution for discretized data points that are partitioned among parallel processors 104 of computer cluster where each processor is assigned few grid points. The present invention also solves a technological problem in parallel computer network processing, namely network latency where communication of data values between adjacent grid points imposes limits on the number of parallel processor nodes that can be used for the purposes of simulation.

The present invention extends the scaling limit by exchanging fewer, yet larger batches of data between computing nodes. The present invention extends the scaling limit in these conditions by retaining the data that needs to be communicated assembled and arranged in the individual processor nodes until it is necessary to communicate that data in order to perform further computations. When this becomes the case, the assembled and organized data is communicated as a single large data group, instead of several of multiple intermediate communications each composed of several smaller batches of data.

As indicated at step 201 (FIG. 2), processing by the data processing system D according to the present invention begins with receiving initialization and time stepping functions or parameters for the specified complex numerical simulation to be performed. During step 201, initial conditions and initial parameter values of the physical or technological process being simulated, initial simulation time step conditions for the simulation and a specified number of simulation time steps for which the simulation is to be performed are also received in the data processing system D.

Types of Components of Assembled Simulation Data in Three Dimensional Space (3D)

Figure 4A:
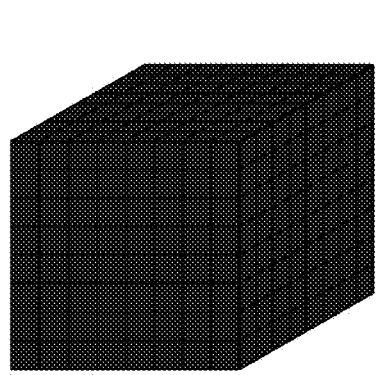
FIGS. 4A, 4B, 4C, 4D, 4E, 4F, 4G, 4H, 4I, 4J and 4K are schematic diagrams illustrating an example of operation of the data processing system of FIG. 1 according to a portion of the workflow of FIG. 2.
Figure 4B:
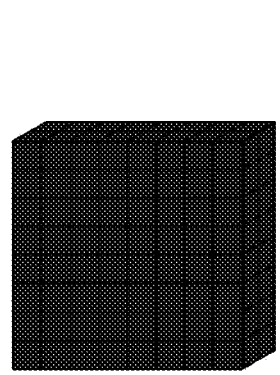
Figure 4C:
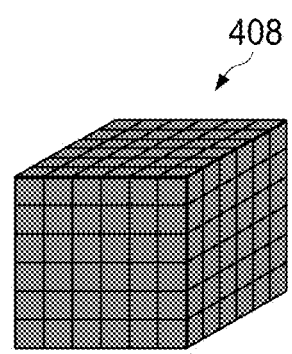
Figure 4D:
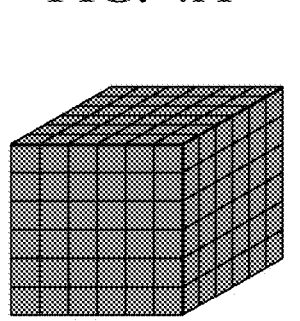
Figure 4E:
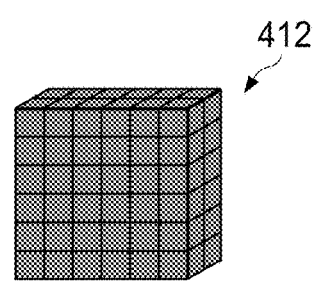
Figure 4F:
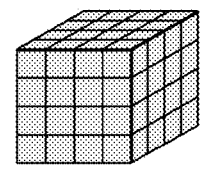

Operation of the data processing system D in three dimensional space (3D) according to the present invention has four main space-time components. Two of these space-time components have three permutations. Therefore, in total, the data processing system D has eight space-time components of assembled data to include all possible permutation of x, y, and z axes. Operation starts with step 202 (FIG. 2) for formation of a cubic subdomain partition 400, such as shown in FIG. 4A, representing schematically, an example of the discretized data points partitioned to an individual processor node 104. The cube 400 shrinks as Swept 3D processing advances in time until it becomes a small 2 by 2 by 2 cube such as shown in FIG. 4I as 402. The first space-time component of assembled simulator data formed during step 202 is termed a shrinking cube. The first communication between and among master nodes 100 and processor nodes 104, as indicated at step 204, takes place after the shrinking cube is formed during step 202. After that, during step 206 the outcomes of forming the shrinking cubes 420 are properly connected together, as shown in FIG. 4K, to form another type of component that is referred to as a beam.

Because of the methodology working with three spatial axes, three beams are formed during step 206 and are identified by their directions as Latitudinal, Longitudinal, and Altitudinal beams. FIG. 5 shows the steps involved in forming Longitudinal beams.

Figure 5L:
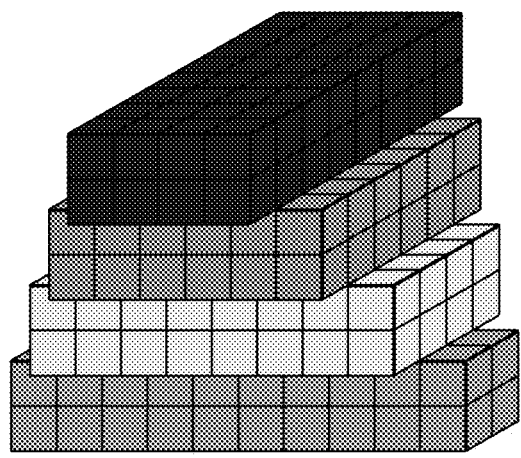
Figure 6A:
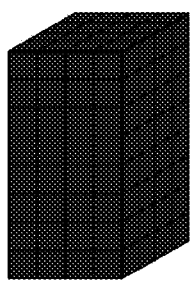
FIGS. 6A, 6B, 6C, 6D, 6E, 6F, 6G, 6H, 6I, 6J, 6K and 6L are schematic diagrams illustrating an example of operation of the data processing system of FIG. 1 according to a further portion of the workflow of FIG. 2.
Figure 6B:
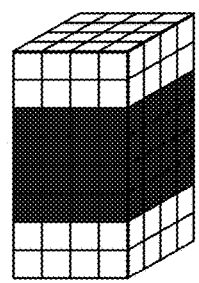
Figure 6C:
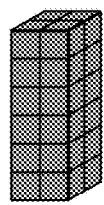
Figure 6D:
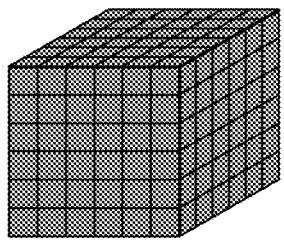
Figure 6E:
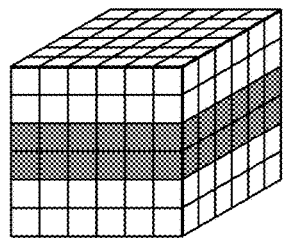
Figure 6F:
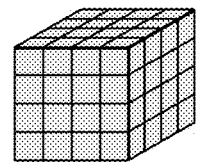
Figure 6G:
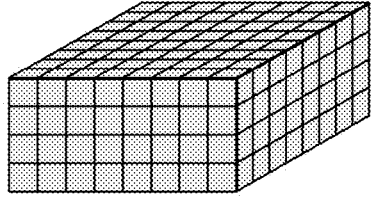
Figure 6H:
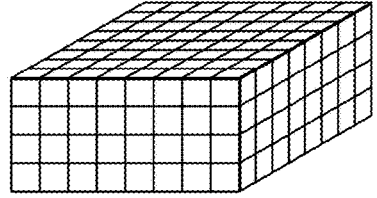
Figure 6I:
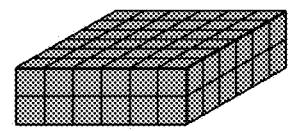
Figure 6J:
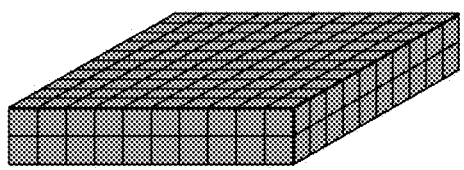
Figure 6K:
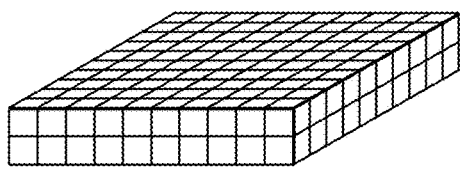
Figure 6L:
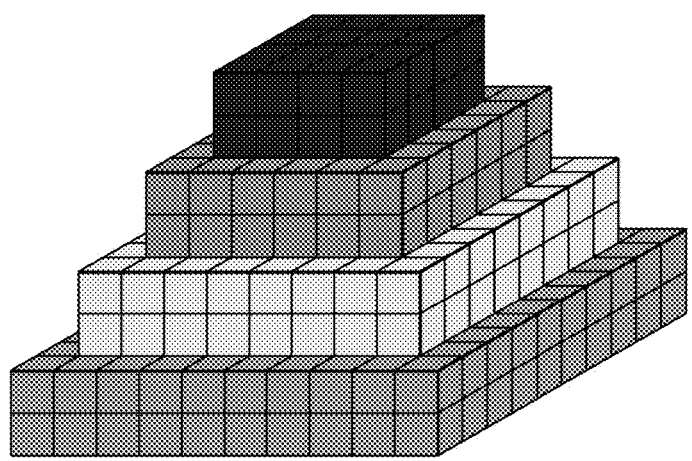

After the Latitudinal, Longitudinal, and Altitudinal beams are formed during step 206, the data processing system D during step 208 performs a second communication between and among master nodes 100 and processor nodes 104. After communication step 208, which communicates the end result of forming the beams as shown in FIG. 5L, the data processing system D during step 210 builds internal growing faces of additional elements in the form of cubes which are defined as cores. Again, working on x, y, and z axes the cores formed during step 210 are referred to as Latitudinal, Longitudinal, and Altitudinal cores. FIG. 6L in FIG. 6 illustrates a bottom Altitudinal core. After building the cores during step 210, the data processing system D during step 212 performs its third, communication between and among master nodes 100 and processor nodes 104.

During step 214 the data processing system D forms a last space-time component assembled the data for the numerical simulation. This fourth component starts by producing a 2 by 2 by 2 cube as shown schematically at 7B in FIG. 7 which grows in size to a size like that with which processing began, as indicated at 7H in FIG. 7.

Step 216 is performed after forming the 3-D Cube during step 214 for the present simulation time step. Step 216 determines if the specified number of simulation time steps required for the numerical simulation have been performed. If it is indicated during step 216 that the specified number of simulation time steps for the numerical simulation have been performed, processing by the data processing system D proceeds to step 220.

During step 220, the results of the numerical simulation are stored in appropriate storage location in memory 106 or other memory of the data processing system D. The results of the numerical simulation can also be made available through graphical display 110 of user interface 108 for inspection, study and analysis.

If the results of step 216 indicate that the specified number of simulation time steps for the numerical simulation being performed not yet occurred, the simulation time step is incremented or advanced, and processing returns to step 201.

FIG. 3 is a diagram illustrating at 300 schematically the assembly of the 3-dimensional spatial components during operation of the data processing system D according to the processing workflow sequence 200 of according to FIG. 2. The arrows contained in the horizontal rows of the diagram 300 indicate the growing and shrinking behavior of the x, y, and z axes of each space-time components during the steps of the processing sequence 200. Arrows pointing diagonally downwardly in FIG. 3 indicate that the particular axis reduces dimensionality during the formation of that particular component. Thus, formation of the cube during step 204 reduces dimensionality along each of x, y, and z axes of the spatial coordinates of shrinking the 3-dimensional cube.

Similarly, diagram 300 illustrates that during step 206 arrows pointing diagonally upwardly indicate that the formation of the 3-dimensional beams increases dimensionality depending on the beam being formed by increasing dimensionality on one axis. Decreasing dimensionality during step 206 is indicated by diagonally downwardly pointing arrows along the other two spatial coordinate axes of the three-dimensional beams.

Diagram 300 further illustrates that during step 210 arrows pointing diagonally upwardly indicate that the formation of the three-dimensional cores increases dimensionality depending upon the core being formed by increasing dimensionality on one axis. Decreasing dimensionality during step 210 is indicated by diagonally downwardly pointing arrows along the other two spatial coordinate axes of the three dimensional cores.

During step 214, as indicated in diagram 300, dimensionality is increased along each of the X, Y, and Z axes of the spatial coordinates during growing of the three-dimensional core. During the formation of that particular space-time component. It should be noted that the x, y, and z axes of the shrinking cube space-time component of the system reduce dimensionality. The following sections list in more detail about each space-time component of Swept 3D.

Swept 3 D Shrinking Cube

The Shrinking Cube component such as shown at 400 (FIG. 4A) is four-dimensional in discrete space-time. The three spatial dimensions are in discretized with a grid indexed by (i,j,k) for the three spatial dimensions. The time dimension is discretized with processing time steps indexed by L. The first processing time step in the shrinking cube is denoted as 0 and the last processing time step as n/2−1, simulation is illustrated, and each grid point has a value as a result of the numerical simulation by stencil operation, as will be described, in the following form: $u_{i,j,k}^{L+1} = u_{i,j,k}^{L} + 1$. For illustration and ease of understanding, the fourth or time dimension of the data being processed as simulation proceeds is color coded, with blue for a processing time step L=0; orange for processing time step L=1; yellow for processing time step L=2; green for processing time step L=3; and red for processing time step L=4. This color coding is maintained throughout the present application. The processing time steps are those of the operation of the data processing system rather than the simulation time steps referred to in connection with the simulation workflow sequence illustrated in FIG. 2

The methodology for building the Swept 3D shrinking cube, written in pseudo code is set forth in the following Table 1.

TABLE 1

Building the Swept 3D Shrinking Cube

```
(𝒩, 𝒮, ℰ, 𝒲, 𝒯, ℬ) = function ShrinkingCube (St, 𝒞)
Input: St: a list of stencil operations
       𝒞: an n by n by n array representing the Cubic partition
Output: 𝒩, 𝒮, ℰ, 𝒲, 𝒯, ℬ: 6 arrays representing the shrinking faces of the cube
𝒟_{1:n,1:n,1:n} ← 𝒞;
𝒩 ← ∅, 𝒮 ← ∅, ℰ ← ∅, 𝒲 ← ∅, 𝒯 ← ∅, ℬ ← ∅;

for L = 0, ... , n/2 − 1 do
| 𝒩^L ← 𝒟_{L+1:n−L,L+1,L+2,L+1:n−L}  𝒩 ← 𝒩 ∪ 𝒩^L
| 𝒮^L ← 𝒟_{L+1:n−L,n−L−1:n−L,L+1:n−L}  𝒮 ← 𝒮 ∪ 𝒮^L
| ℰ^L ← 𝒟_{n−L−1:n−L,L+1:n−L,L+1:n−L}  ℰ ← ℰ ∪ ℰ^L
| 𝒲^L ← 𝒟_{L+1:L+2,L+1:n−L,L+1:n−L}  𝒲 ← 𝒲 ∪ 𝒲^L
| 𝒯^L ← 𝒟_{L+1:n−L,L+1:n−L,L+1,L+2}  𝒯 ← 𝒯 ∪ 𝒯^L
| ℬ^L ← 𝒟_{L+1:n−L,L+1:n−L,n−L−1:n−L}  ℬ ← ℬ ∪ ℬ^L
| for k = 2 + L, ... , n − L − 1 do
|  | for j = 2 + L, ... , n − L − 1 do
|  |  | for i = 2 + L, ... , n − L − 1 do
|  |  |  | 𝒰_{i,j,k} = St_L({𝒟_{i',j',k'}, |i' − i| ≤ 1, |j' − j| ≤ 1, |k' − k| ≤ 1})
|  |  | end
|  | end
| end
| 𝒰 ↔ 𝒟
end
``` where n is the number of grids along any one of the three spatial dimensions of the six side faces of the cube. The initial cubic subdomain is of a size n by n by n grid points at processing time step 0. As the processing time step advances, the six faces of the cube shrink, maintaining a cubic shape, whose side length decreases by two for each time step. At the last time step, the cubic size is 2 by 2 by 2.

Building the shrinking cube takes the form of computing values of the grid data points at each of the grids as the cube shrinks from an original size as shown at 400 in FIG. 4A until it is a 2 by 2 by 2 cube in size, as shown at 402 in FIG. 4I. After the shrinking cube is fully built, the values at each of the space-time grids on the shrinking faces 402 in FIG. 4K form the output, which provides input into the other components of the Swept 3D processing methodology. Building the shrinking cube begins with values at an initial cubic partition and simulation time step 0 as inputs, then applying the stencil operation on the space-time grid points at each successive time steps: 1, 0+, ... , 0+n/2−1.

Considering FIGS. 4A through 4I as an example, a cubic subdomain of 8×8×8 three dimensional grid points of the In the processing according to Table 1 above and in each of the subsequent Tables of methodology being performed according to the present invention, a data initialization function C and a time-stepping stencil operation function St are user defined input variables provided as inputs during processing step 201. The input variables to the data initialization function C are the global (i,j,k) indices for each spatial point and for a spatial point structure representing a 3D stencil.

The following table includes in pseudo code format an exemplification of the initialization function interface:

```
Init(pointIndex i,pointIndex j,pointIndex k,specialPoint3D p)
{
   Based on the location of the point (i,j,k), set its initial data
      p,inputs [0] = variable 0 initial value
      p,inputs [1] = variable 1 initial value
      p,inputs [n] = variable n intial value
}
```

The time-stepping function in the interface is a processing operation during which the PDE solution is performed. The input variables to the time stepping function are the index of which processing time step or sub-time step to be executed and a three-dimensional, 27-point stencil spatial point structure. The following pseudocode shows the time stepping function of such an interface.

```
timestep(timestep i,spacialPoint3D p)
{
  Based on the value of i, perform the proper operation on p
}
```

An example (FIG. 4A) of building a Swept 3D shrinking cube according to step 202 in FIG. 2, has a cubic subdomain partition assigned to one of the processor nodes 104 as shown at in FIG. 4A of size 8×8×8 at time L=0. The shrinking cube methodology proceeds as follows. First, a copy is made of two layers of each of the six square faces of the 8×8×8 cube. FIG. 4B shows an example 2 by 8×8 face at time level L=0. Each cube having East, West, North, South, Top and Bottom faces, resulting in a total of six cubes of like form to that shown in FIG. 4B. FIG. 4C illustrates the subsequent stencil operation on level 0 for the internal 6×6×6 cube according to the processing described above in Table 1. The stencil operation is, as noted above, the processing operation during which the PDE solution or other form of numerical solution is performed.

Proceeding to the next level, a copy is made of two layers of the six faces of the cube. FIG. 4E shows a sample 2 by 6×6 face of the cube at time level L=1. FIG. 4F illustrates the subsequent stencil operation on level one for the internal 4×4×4 cube.

Figure 4G:
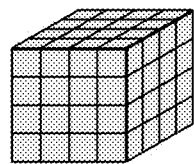
Figure 4H:
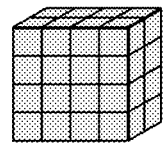
Figure 4I:
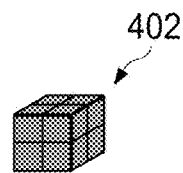
Figure 4J:
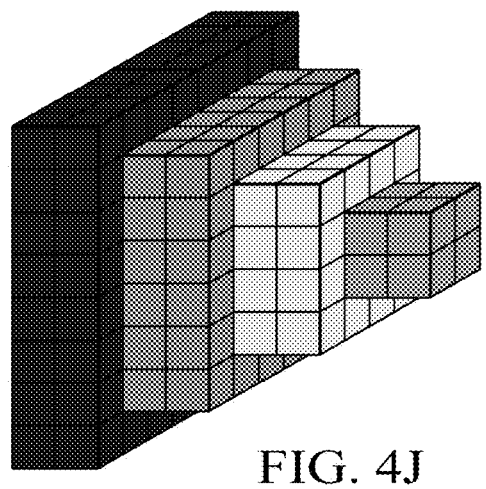
Figure 4K:
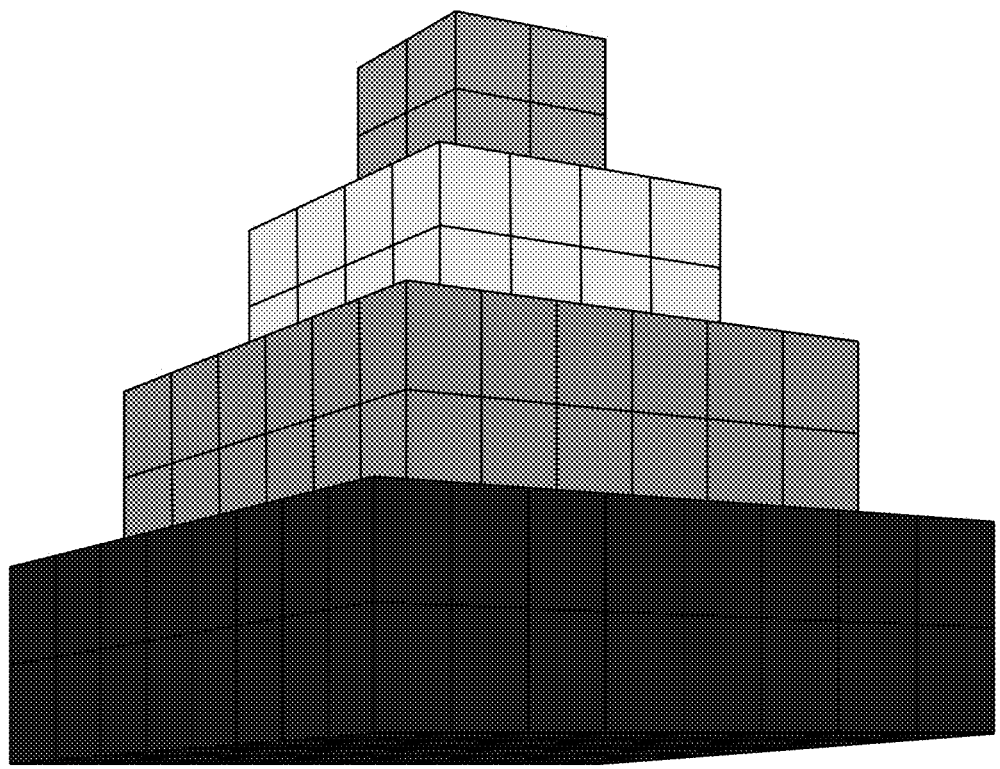
Figure 4K:
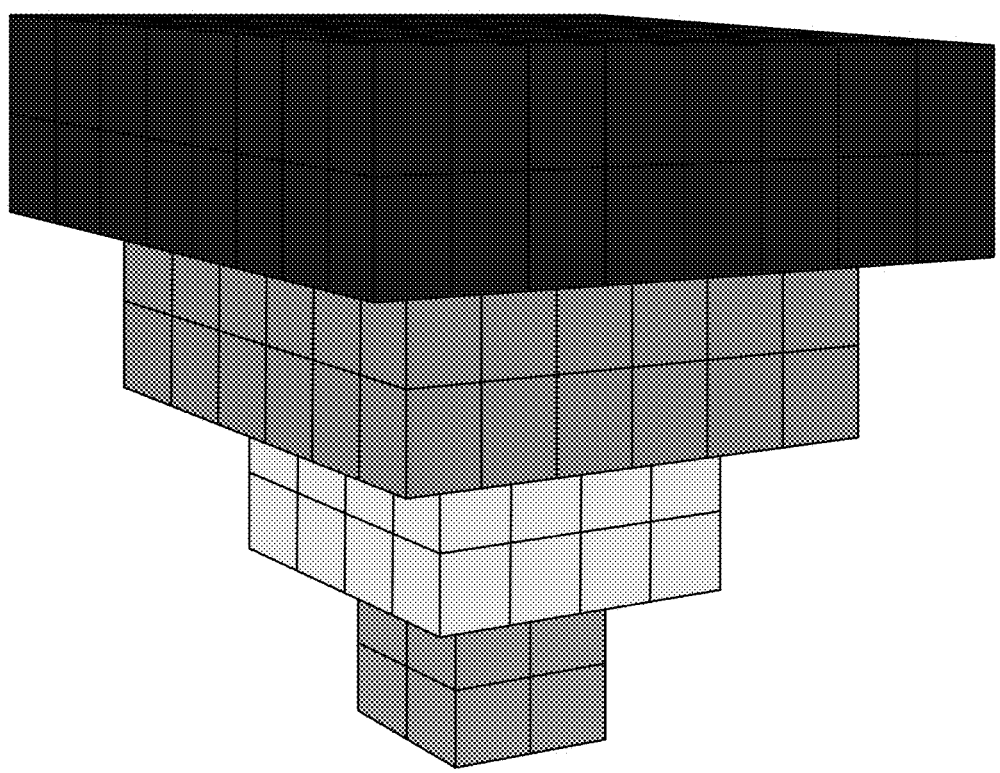

FIGS. 4G through 4I illustrate the process on the next level in which stencil operation is done to the internal 2×2×2 cube. After this level, no further stencil operation can be performed. It is to be noted that the last 2 by 2×2 cube in FIG. 4I is shared by all of the six faces of the cube. Accordingly, it can be seen that the present invention properly packed the six shrinking faces of the cube and prepared them for output. FIG. 4J shows one of the outputs of the shrinking cube methodology of the present invention, namely the West faces.

Swept 3D Latitudinal, Longitudinal and Altitudinal Beams

Step 206 of the operation of the data processing system D according to the present invention connects together the outputs of the shrinking cubes formed during step 202 by each of the processor nodes 104, after they have been communicated to contiguous processor nodes during step 204, to form three components that are termed beams. Beams differ from each other only in their orientation. Because of the methodology working with three axes, the Swept 3D methodology constructs three such beams, which are named to correspond to their orientation or direction: a Latitudinal beam, a Longitudinal beam, and an Altitudinal beam.

A Swept 3D beam is a four-dimensional, discrete space-time, structure. Similar to the Swept 3D shrinking cube, the three spatial dimensions are discretized with a grid indexed by (i, j, k) for the three spatial dimensions. The time dimension is discretized with time steps indexed by, again with the first time step at L=0. The Latitudinal, Longitudinal, and Altitudinal Swept 3D beams have the same time span as the shrinking cube.

Considering the four-dimensional discrete space-time dimensions, each Swept 3D beam connects two adjacent 2 by 2×2 cubes by the time it is fully formed. Building the Swept 3D beam according to the present invention is defined as calculating all possible space-time values in the space between two adjacent 2 by 2×2 by two cubes. This processing starts by linking two sets of shrinking cube faces, two outputs of a shrinking cube and ends with a beam of length n+2.

The outputs of the beam construction are four 4-dimensional structures. A Longitudinal beam requires East and West cube shrinking faces and generates North South top and bottom sides. A Longitudinal beam requires North and South cube shrinking faces and generates east, west, top and bottom sides. An Altitudinal beam requires top and bottom Cube shrinking faces and generates North, South, East and West sides.

The methodology for building the Latitudinal, Longitudinal and Altitudinal beams, written in pseudo code, is set forth in the following Tables 2, 3 and 4, respectively.

TABLE 2

Building the Swept 3D Latitudinal Beam $(\mathcal{N}, \mathcal{S}, \mathcal{T}, \mathcal{B})$ = function LatitudinalBeam (St, $\mathcal{E}, \mathcal{W}$)
Input: St: a list of stencil operations
$\mathcal{E}, \mathcal{W}$: 2 representing the shrinking East and West faces of the shrinking cube
Output: $\mathcal{N}, \mathcal{S}, \mathcal{T}, \mathcal{B}$: 4 arrays representing the outer-sides of the octahedron
$\mathcal{N} \leftarrow \emptyset, \mathcal{S} \leftarrow \emptyset, \mathcal{T} \leftarrow \emptyset, \mathcal{B} \leftarrow \emptyset;$ for $L = 0, \ldots, \frac{n}{2} - 1$ do $| \mathcal{D}_{n/2+L+1:n/2+L+2, L+1:n-L, L+1:n-L} \leftarrow \mathcal{E}^L$
$| \mathcal{D}_{n/2-L-1:n/2-L, L+1:n-L, L+1:n-L} \leftarrow \mathcal{W}^L$
$| \mathcal{N}^L \leftarrow \mathcal{D}_{n/2-L-1:n/2+L+2, L+1:L+2, L+1:n-L} \mathcal{N} \leftarrow \mathcal{N} \cup \mathcal{N}^L$
$| \mathcal{S}^L \leftarrow \mathcal{D}_{n/2-L-1:n/2+L+2, n-L-1:n-L, L+1:n-L} \mathcal{S} \leftarrow \mathcal{S} \cup \mathcal{S}^L$
$| \mathcal{T}^L \leftarrow \mathcal{D}_{n/2-L-1:n/2+L+2, L+1:n-L, L+1:L+2} \mathcal{T} \leftarrow \mathcal{T} \cup \mathcal{T}^L$
$| \mathcal{B}^L \leftarrow \mathcal{D}_{n/2-L-1:n/2+L+2, L+1:n-L, n-L-1:n-L} \mathcal{B} \leftarrow \mathcal{B} \cup \mathcal{B}^L$
| for k = 2 + L, . . . ,n − L − 1 do
| | for j = 2 + L, . . . ,n − L − 1 do
| | | for i = n/2 − L, . . . ,n/2 + L + 1 do
| | | | $\mathcal{U}_{i,j,k}$ = St$_L(\{\mathcal{D}_{i',j',k'}, |i' - i| \leq 1, |j' - j| \leq 1, |k' - k| \leq 1\})$
| | | end
| | end
| end
| $\mathcal{U} \leftrightarrow \mathcal{D}$
end

TABLE 3

Building the Swept 3D Longitudinal Beam $(\mathcal{E}, \mathcal{W}, \mathcal{T}, \mathcal{B})$ = function LongitudinalBeam (St, $\mathcal{N}, \mathcal{S}$)
Input: St: a list of stencil operations
$\mathcal{N}, \mathcal{S}$: 2 representing the shrinking North and South faces of the shrinking cube
Output: $\mathcal{E}, \mathcal{W}, \mathcal{T}, \mathcal{B}$: 4 arrays representing the outer-sides of the octahedron
$\mathcal{E} \leftarrow \emptyset, \mathcal{W} \leftarrow \emptyset, \mathcal{T} \leftarrow \emptyset, \mathcal{B} \leftarrow \emptyset;$ for $L = 0, \ldots, \frac{n}{2} - 1$ do TABLE 3-continued Building the Swept 3D Longitudinal Beam

| | $\mathcal{D}_{L+1:n-L,n/2-L-1:n/2-L,L+1:n-L} \leftarrow \mathcal{N}^L$
| | $\mathcal{D}_{L+1:n-L,n/2+L+1:n/2+L+2,L+1:n-L} \leftarrow \mathcal{S}^L$
| | $\mathcal{E}^L \leftarrow \mathcal{D}_{n-L-1:n-L,n/2-L-1:n/2+L+2,L+1:n-L} \mathcal{E} \leftarrow \mathcal{N} \cup \mathcal{N}^L$
| | $\mathcal{W}^L \leftarrow \mathcal{D}_{L+1:L+2,n/2-L-1:n/2+L+2,L+1:n-L} \mathcal{W} \leftarrow \mathcal{S} \cup \mathcal{S}^L$
| | $\mathcal{T}^L \leftarrow \mathcal{D}_{L+1:n-L,n/2-L-1:n/2+L+2,L+1:L+2} \mathcal{T} \leftarrow \mathcal{T} \cup \mathcal{T}^L$
| | $\mathcal{B}^L \leftarrow \mathcal{D}_{L+1:n-L,n/2-L-1:n/2+L+2,n-L-1:n-L} \mathcal{B} \leftarrow \mathcal{B} \cup \mathcal{B}^L$
| for k = 2 + L, ... ,n − L − 1 do
| | for j = n/2 − L, ... ,n/2 + L + 1 do
| | | for i = 2 + L, ... ,n − L − 1 do
| | | | $\mathcal{U}_{i,j,k} = St_L(\{\mathcal{D}_{i',j',k'}, |i' - i| \leq 1, |j' - j| \leq 1, |k' - k| \leq 1\})$
| | | end
| | end
| end
| $\mathcal{U} \leftrightarrow \mathcal{D}$
end

TABLE 4

Building the Swept 3D Altitudinal Beam $(\mathcal{N}, \mathcal{S}, \mathcal{E}, \mathcal{W})$ = function AltitudinalBeam (St, $\mathcal{T}$, $\mathcal{B}$)
Input: St: a list of stencil operations
  $\mathcal{T}, \mathcal{B}$: 2 a representing the shrinking Top and Bottom faces of the shrinking cube
Output: $\mathcal{N}, \mathcal{S}, \mathcal{E}, \mathcal{W}$: 4 arrays representing the outer-sides of the octahedron
$\mathcal{N} \leftarrow \emptyset, \mathcal{S} \leftarrow \emptyset, \mathcal{E} \leftarrow \emptyset, \mathcal{W} \leftarrow \emptyset$;

for $L = 0, \ldots, \frac{n}{2} - 1$ do

Figure 5A:
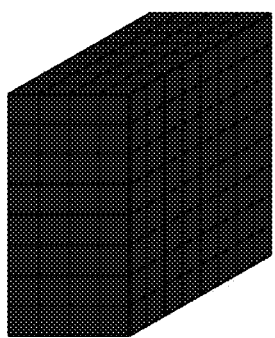
FIGS. 5A, 5B, 5C, 5D, 5E, 5F, 5G, 5H, 5I, 5J, 5K and 5L are schematic diagrams illustrating an example of operation of the data processing system of FIG. 1 according to another portion of the workflow of FIG. 2.
Figure 5B:
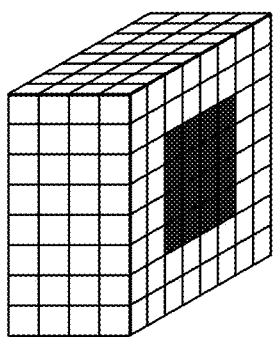
Figure 5C:
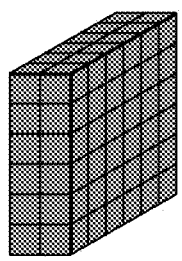

| $\mathcal{D}_{L+1:n-L,L+1:n-L,n/2-L-1:n/2-L} \leftarrow \mathcal{T}^L$
| $\mathcal{D}_{L+1:n-L,L+1:n-L,n/2+L+1:n/2+L+2} \leftarrow \mathcal{B}^L$
| $\mathcal{N}^L \leftarrow \mathcal{D}_{L+1:n-L,L+1:L+2,n/2-L-1:n/2+L+2} \mathcal{N} \leftarrow \mathcal{N} \cup \mathcal{N}^L$
| $\mathcal{S}^L \leftarrow \mathcal{D}_{L+1:n-L,n-L-1:n-L,n/2-L-1:n/2+L+2} \mathcal{S} \leftarrow \mathcal{S} \cup \mathcal{S}^L$
| $\mathcal{E}^L \leftarrow \mathcal{D}_{n-L-1:n-L,L+1:n-L,n/2-L-1:n/2+L+2} \mathcal{E} \leftarrow \mathcal{E} \cup \mathcal{E}^L$
| $\mathcal{W}^L \leftarrow \mathcal{D}_{L+1:L+2,L+1:n-L,n/2-L-1:n/2+L+2} \mathcal{W} \leftarrow \mathcal{W} \cup \mathcal{W}^L$
| for k = n/2 − L, ... ,n/2 + L + 1 do
| | for j = 2 + L, ... ,n − L − 1 do
| | | for i = 2 + L, ... ,n − L − 1 do
| | | | $\mathcal{U}_{i,j,k} = St_L(\{\mathcal{D}_{i',j',k'}, |i' - i| \leq 1, |j' - j| \leq 1, |k' - k| \leq 1\})$
| | | end
| | end
| end
| $\mathcal{U} \leftrightarrow \mathcal{D}$
end FIGS. 5A through 5K illustrate schematically an example of building a Longitudinal beam for a cubic partition of side length 8. The inputs are East and West shrinking faces that are generated by a shrinking cube, such as that shown at 4J in FIG. 4. In the first step of building a Longitudinal beam starts by linking the first two layers of the 8×8 East and West cube faces. This forms what is shown in FIG. 5A, a domain partition of size 4×8×8 at time level L=0. After that, processing forms a copy of the north, south, top and bottom sides. The copied layers are shown at in white in FIG. 5B. The last processing step for this level is to perform stencil operations for the inner 2×6×6 partition to move it to time level L=1 as shown in FIG. 5C.

Figure 5D:
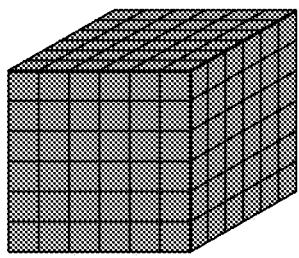
Figure 5E:
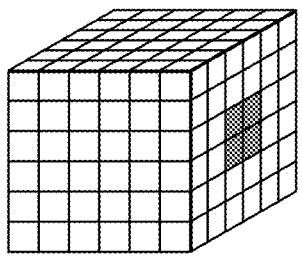
Figure 5F:
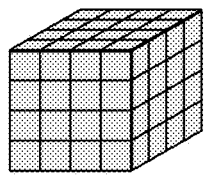

On the next level, the next two layers of size 6×6 from both the East and West cube faces are loaded as inputs and are properly placed to the east and west of the 2×6×6 domain partition generated from the previous level and shown in FIG. 5C. This forms a partition of size 6×6×6 at time level L=1 as shown in FIG. 5D. A copy is in made of the outer two layers of the north, south, top and bottom sides, as shown in white in FIG. 5E. The work at this level is concluded by performing stencil operations to the inner four by 4×4 partition to move it to time level L=2 as shown in FIG. 5F.

Figure 5G:
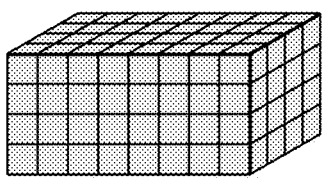
Figure 5H:
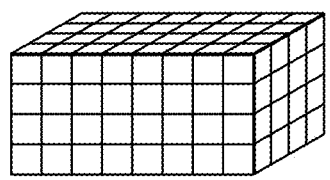
Figure 5I:
Figure 5J:
Figure 5K:
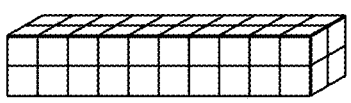

Proceeding to the next level in performing similar operations as done in the previous two levels, the next level results in a 6 by 2×2 partition at time level L=3 and as shown in FIG. 5I FIGS. 5G through 5I summarize the work done at this level. Processing concludes with loading the last two layers of the East and West inputs and placing them next to the 6 by 2×2 partition to form a 10 by 2×2 partition. This common partition is copied to the north, south, top and bottom sides as shown in FIGS. 5J through 5K. This concludes formation of the 10 by 2×2 partition, which is termed a Longitudinal beam. The four outputs of the processing are the stacked north, south, top and bottom sides. FIG. 5L demonstrates a sample output for the top sides.

The Latitudinal and Altitudinal beams are constructed in a comparable manner according to the methodology of the Longitudinal beams, and is performed according to pseudo code set forth in Tables 2, 3 and 4, respectively.

Swept 3D Latitudinal and Longitudinal and Altitudinal Cores

After the second communication is done during step 208, Swept 3D starts building internal growing faces of cubes to be used as cores for the remaining Swept 3D components. And for this reason, the third space-time component of Swept 3D is designated as a "Core". Again, working on x, y, and z axes makes Swept 3D build Latitudinal, Longitudinal, and Altitudinal cores. The components of the three Swept 3D cores, namely Swept 3D Latitudinal, Longitudinal and Altitudinal cores, differ only in their orientation. A swept 3D core is a four-dimensional discrete space-time structure. Similar to the previous swept 3D components, the three spatial dimensions are discretized with a grid indexed by (i, j, k) and the time dimension is discretized with time steps indexed by L.

The Swept 3D cores have the same time span as the shrinking cube and beams. Thinking of the four-dimensional discrete space-time, the cores represent growing faces of cubes. Building the Swept 3D core means calculating all possible space-time values in the cube growing faces. The process starts by linking 2 pair of sides, 4 outputs of Swept 3D beams, and ends with a set of growing cube faces. FIG. 6 illustrates how the Swept 3D core component is built.

Again, depending on the orientation of the constructed core, the constructed cores are designated as Longitudinal, Latitudinal, or Altitudinal cores. It is to be recalled that as shown in FIG. 3, the Longitudinal cores grow spatially during step 214 in they and z axes. The Latitudinal cores grow in the x and z axes, while the Altitudinal cores grow in the x and y axes.

The outputs of the core construction are two four-dimensional structures. A Longitudinal core requires North, South, Top and Bottom sides and outputs East and West growing faces. A Latitudinal core requires East, West, Top, and Bottom sides and outputs North and South cube growing faces. An Altitudinal core requires East, West, North, and South sides and generates Top and Bottom cube growing faces. Notice the relationship or the pattern between the core orientation, its inputs and its outputs.

The methodologies for building the Latitudinal, Longitudinal, and Altitudinal cores are written in pseudo code, is set forth in the following Tables 5, 6 and 7.

TABLE 5

Building the Swept 3D Latitudinal Core $(\mathcal{E}, \mathcal{W})$ = function LatitudinalCore (St, $\mathcal{N}, \mathcal{S}, \mathcal{T}, \mathcal{B}$)
Input: St: a list of stencil operations
  $\mathcal{N}, \mathcal{S}, \mathcal{T}, \mathcal{B}$: 4 arrays representing the North, South, Top, and Bottom sides of the shrinking Octahedrons
Output: $\mathcal{E}, \mathcal{W}$: 2 arrays representing cube cores
$\mathcal{E} \leftarrow \emptyset, \mathcal{W} \leftarrow \emptyset;$ for $L = 0, \ldots, \frac{n}{2} - 1$ do

| $\mathcal{D}_{L+1:n-L,n/2-L:n/2-L,n/2-L-1:n/2+L+2} \leftarrow \mathcal{N}^L$
| $\mathcal{D}_{L+1:n-L,n/2+L+1:n/2+L+2,n/2-L-1:n/2+L+2} \leftarrow \mathcal{S}^L$
| $\mathcal{D}_{L+1:n-L,n/2-L-1:n/2+L+2,n/2-L-1:n/2-L} \leftarrow \mathcal{T}^L$
| $\mathcal{D}_{L+1:n-L,n/2-L-1:n/2+L+2,n/2+L+1:n/2+L+2} \leftarrow \mathcal{B}^L$
| $\mathcal{E}^L \leftarrow \mathcal{D}_{n-L-1:n-L,n/2-L-1:n/2+L+2,n/2-L-1:n/2+L+2}$ $\mathcal{E} \leftarrow \mathcal{E} \cup \mathcal{E}^L$
| $\mathcal{W}^L \leftarrow \mathcal{D}_{L+1:L+2,n/2-L-1:n/2+L+2,n/2-L-1:n/2+L+2}$ $\mathcal{W} \leftarrow \mathcal{W} \cup \mathcal{W}^L$
| for k = n/2 − L, . . . ,n/2 + L + 1 do
| | for j = n/2 − L, . . . ,n/2 + L + 1 do
| | | for i = 2 + L, . . . ,n − L − 1 do
| | | | $\mathcal{U}_{i,j,k} = St_L(\{\mathcal{D}_{i',j',k'}, |i' - i| \leq 1, |j' - j| \leq 1, |k' - k| \leq 1\})$
| | | end
| | end
| end
| $\mathcal{U} \leftrightarrow \mathcal{D}$
end

TABLE 6

Building the Swept 3D Longitudinal Core $(\mathcal{N}, \mathcal{S})$ = function LongitudinalCore (St, $\mathcal{E}, \mathcal{W}, \mathcal{T}, \mathcal{B}$)
Input: St: a list of stencil operations
  $\mathcal{E}, \mathcal{W}, \mathcal{T}, \mathcal{B}$: 4 arrays representing the East, West, Top, and Bottom sides of the shrinking Octahedrons
Output: $\mathcal{N}, \mathcal{S}$: 2 arrays representing cube cores
$\mathcal{N} \leftarrow \emptyset, \mathcal{S} \leftarrow \emptyset;$ for $L = 0, \ldots, \frac{n}{2} - 1$ do

| $\mathcal{D}_{n/2+L+1:n/2+L+2,L+1:n-L,n/2-L-1:n/2+L+2} \leftarrow \mathcal{E}^L$
| $\mathcal{D}_{n/2-L-1:n/2-L,L+1:n-L,n/2-L-1:n/2+L+2} \leftarrow \mathcal{W}^L$
| $\mathcal{D}_{n/2-L-1:n/2+L+2,L+1:n-L,n/2-L-1:n/2-L} \leftarrow \mathcal{T}^L$
| $\mathcal{D}_{n/2-L-1:n/2+L+2,L+1:n-L,n/2+L+1:n/2+L+2} \leftarrow \mathcal{B}^L$
| $\mathcal{N}^L \leftarrow \mathcal{D}_{n/2-L-1:n/2+L+2,L+1:L+2,n/2-L-1:n/2+L+2}$ $\mathcal{N} \leftarrow \mathcal{N} \cup \mathcal{N}^L$
| $\mathcal{S}^L \leftarrow \mathcal{D}_{n/2-L-1:n/2+L+2,n-L-1:n-L,n/2-L-1:n/2+L+2}$ $\mathcal{S} \leftarrow \mathcal{S} \cup \mathcal{S}^L$
| for k = n/2 − L, . . . ,n/2 + L + 1 do
| | for j = 2 + L, . . . ,n − L − 1 do
| | | for i = n/2 − L, . . . ,n/2 + L + 1 do
| | | | $\mathcal{U}_{i,j,k} = St_L(\{\mathcal{D}_{i',j',k'}, |i' - i| \leq 1, |j' - j| \leq 1, |k' - k| \leq 1\})$
| | | end
| | end
| end
| $\mathcal{U} \leftrightarrow \mathcal{D}$
end

TABLE 7

Building the Swept 3D Altitudinal Core $(\mathcal{T}, \mathcal{B})$ = function AltitudinalCore (St, $\mathcal{N}, \mathcal{S}, \mathcal{E}, \mathcal{W}$)
Input: St: a list of stencil operations
  $\mathcal{N}, \mathcal{S}, \mathcal{E}, \mathcal{W}$: 4 arrays representing the North, South, East, and Wes sides of the shrinking Octahedrons
Output: $\mathcal{T}, \mathcal{B}$: 2 arrays representing cube cores
$\mathcal{T} \leftarrow \emptyset, \mathcal{B} \leftarrow \emptyset;$ for $L = 0, \ldots, \frac{n}{2} - 1$ do TABLE 7-continued Building the Swept 3D Altitudinal Core

| $\mathcal{D}_{n/2-L-1:n/2+L+2,n/2-L-1:n/2-L,L+1:n-L} \leftarrow \mathcal{N}^L$
| $\mathcal{D}_{n/2-L-1:n/2+L+2,n/2+L+1:n/2+L+2,L+1:n-L} \leftarrow \mathcal{S}^L$
| $\mathcal{D}_{n/2+L+1:n/2+L+2,n/2-L-1:n/2+L+2,L+1:n-L} \leftarrow \mathcal{E}^L$
| $\mathcal{D}_{n/2-L-1:n/2-L,n/2-L-1:n/2+L+2,L+1:n-L} \leftarrow \mathcal{W}^L$
| $\mathcal{T}^L \leftarrow \mathcal{D}_{n/2-L-1:n/2+L+2,n/2-L-1:n/2+L+2,L+1:L+2}$ $\mathcal{T} \leftarrow \mathcal{T} \cup \mathcal{T}^L$
| $\mathcal{B}^L \leftarrow \mathcal{D}_{n/2-L-1:n/2+L+2,n/2-L-1:n/2+L+2,n-L-1:n-L}$ $\mathcal{B} \leftarrow \mathcal{B} \cup \mathcal{B}^L$
| for k = 2 + L, . . . ,n − L − 1 do
| | for j = n/2 − L, . . . ,n/2 + L + 1 do
| | | for i = n/2 − L, . . . ,n/2 + L + 1 do
| | | | $\mathcal{U}_{i,j,k} = St_L(\{\mathcal{D}_{i',j',k'}, |i' - i| \leq 1, |j' - j| \leq 1, |k' - k| \leq 1\})$
| | | end
| | end
| end
| $\mathcal{U} \leftrightarrow \mathcal{D}$
end Consider now an example that builds an Altitudinal core for a cubic partition of side length n. The inputs are North, South, East and West sides that are generated by Swept 3D Latitudinal and Longitudinal beams. In the first step of the first level, the first two layers of the north, south, east and west sides are linked. This forms a domain partition of size 4×4×8 and time level L=0 as that shown in FIG. 6A. After that, processing forms a copy of the four layers where the upper two layers grow as a top growing face and the lower two grow as bottom growing faces. The copied layers are shown in white in FIG. 6B. The final step in this level of processing is performing stencil operations for the inner 2×2 by six partition to move it to time level L=1 as shown in FIG. 6C.

On the next level, the next two layers are loaded from the north, south, east and west inputs and placed next to the north, south, east and west of the partition just generated from the previous level. This forms a partition of size 6×6×6 at time level L=1 as shown in FIG. 6D. Processing then makes a copy of the four layers. Again, the upper two layers go as a top growing face and the lower two layers go as bottom growing faces. FIG. 6E illustrates the four layers to be copied. Work at this level is concluded by performing stencil operations to the inner 4 by 4×4 partition to move it to the time level L=2 as shown in FIG. 6F.

Proceeding to the next level and doing similar work as done in the previous two levels, this level ends with a 6 by 6 by 2 partition at time level L=3. FIGS. 6G through 6I represent schematically the work done at this level. Processing to build the Latitudinal, Longitudinal and attitudinal cores during step 210 is completed by loading the last two layers of the inputs and placing them appropriately around the 6 by 6 by 2 partition to form a 10 by 10 by 2 partition and copy this common partition to the Top, and Bottom as growing faces. FIGS. 6J through 6K illustrate the results of performing this processing. The two outputs of the algorithm are then in the form of stacked Top and Bottom growing faces, which are referred to as cores. FIG. 6L illustrates a sample output for the Bottom growing faces.

The Longitudinal and Longitudinal cores are constructed in a comparable manner according to the methodology of the Altitudinal beams, and is performed according to the pseudo code set forth in Tables 6 and 7, respectively.

Swept 3D Growing Cube

Building the last space-time component of Swept 3D takes place after the third communication during step 212 is done. This fourth component starts with a 2 by 2 by 2 cube which grows as time advances until its size becomes equal to the n by n by n element size of the starting shrinking cube at the beginning of the processing operation. This fourth component is designated as a Swept 3D Growing Cube. This is the last space-time component of Swept 3D. The Swept 3D core is a four-dimensional, discrete space-time, structure. In this structure, the three spatial dimensions are again discretized with a grid indexed by (i, j, k) and the time dimension is discretized with processing time steps indexed by L.

Formation of the Swept 3D Growing cubes involves an extra level of stencil operation as it grows, in comparison to the previous components of the Swept 3D according to the present invention. Considering the four-dimensional discrete space-time, the growing cubes represent a small cube of size 2 by 2 by 2 which grows with time until it becomes of size n by n by n. Building the Swept 3D growing cube it involves calculating all space-time values in the cube until the entire n by n by n cubic domain is at the same time level. The process begins by linking three pair of growing faces, six outputs of the Swept 3D cores, and concludes with an n by n by n cube. FIG. 7 illustrates how the Swept 3D growing cube component is built according to the present invention.

It is to be noted that in this space-time component the generated partition after every level grows in the x, y, and z axes. The methodology for building the growing cube written in pseudo code, is set forth in Table 8.

TABLE 8

Figure 7A:
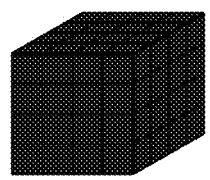
FIGS. 7A, 7B, 7C, 7D, 7E, 7F, 7G and 7H are schematic diagrams illustrating an example of operation of the data processing system of FIG. 1 according to another portion of the workflow of FIG. 2.
Figure 7B:
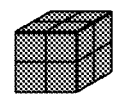
Figure 7C:
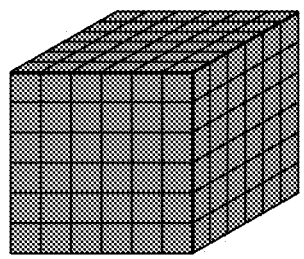
Figure 7D:
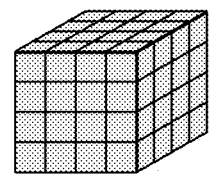
Figure 7E:
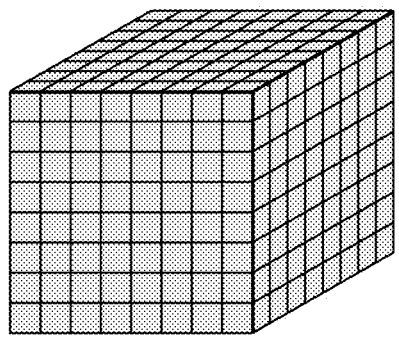
Figure 7F:
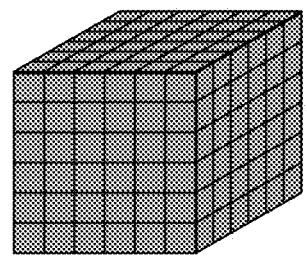
Figure 7G:
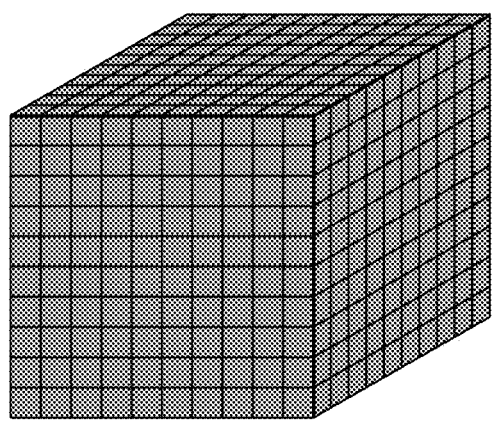
Figure 7H:
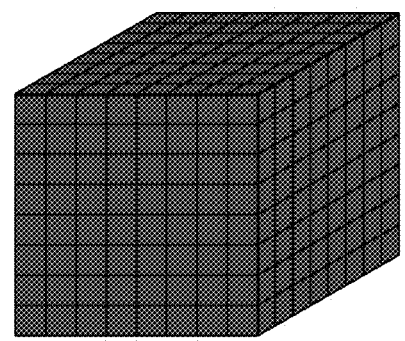

Building the Swept 3D Growing Cube $(\mathcal{T}, \mathcal{B})$ = function AltitudinalCore (St, $\mathcal{N}, \mathcal{S}, \mathcal{E}, \mathcal{W}$)
Input: St: a list of stencil operations
  $\mathcal{N}, \mathcal{S}, \mathcal{E}, \mathcal{W}$: 4 arrays representing the North, South, East, and Wes sides of the shrinking Octahedrons
Output: $\mathcal{T}, \mathcal{B}$: 2 arrays representing cube cores
$\mathcal{T} \leftarrow \emptyset, \mathcal{B} \leftarrow \emptyset$;

for $L = 0, \ldots, \frac{n}{2} - 1$ do $|\mathcal{D}_{n/2-L-1:n/2+L+2, n/2-L-1:n/2-L, L+1:n-L} \leftarrow \mathcal{N}^L$
$|\mathcal{D}_{n/2-L-1:n/2+L+2, n/2+L+1:n/2+L+2, L+1:n-L} \leftarrow \mathcal{S}^L$
$|\mathcal{D}_{n/2+L+1:n/2+L+2, n/2-L-1:n/2+L+2, L+1:n-L} \leftarrow \mathcal{E}^L$
$|\mathcal{D}_{n/2-L-1:n/2-L, n/2-L-1:n/2+L+2, L+1:n-L} \leftarrow \mathcal{W}^L$
$|\mathcal{T}^L \leftarrow \mathcal{D}_{n/2-L-1:n/2+L+2, n/2-L-1:n/2+L+2, L+1:L+2} \quad \mathcal{T} \leftarrow \mathcal{T} \cup \mathcal{T}^L$
$|\mathcal{B}^L \leftarrow \mathcal{D}_{n/2-L-1:n/2+L+2, n/2-L-1:n/2+L+2, n-L-1:n-L} \quad \mathcal{B} \leftarrow \mathcal{B} \cup \mathcal{B}^L$
| for k = 2 + L, ..., n − L − 1 do
| | for j = n/2 − L, ..., n/2 + L + 1 do
| | | for i = n/2 − L, ..., n/2 + L + 1 do
| | | | $\mathcal{U}_{i,j,k} = St_L(\{\mathcal{D}_{i',j',k'}, |i' - i| \leq 1, |j' - j| \leq 1, |k' - k| \leq 1\})$
| | | end
| | end
| end
$|\mathcal{U} \leftrightarrow \mathcal{D}$
end FIG. 7A through 7H illustrates schematically an example of formation of a growing cube for a cubic subdomain partition of size 8 by 8 by 8. At the first level, the first 2 layers of the North, South, East, West, Top, and Bottom growing faces are loaded as inputs, forming a 4 by 4 by 4 partition. It is to be noted that the partition is at time level L=0 as shown in FIG. 7A. A stencil operation can now be performed to the inner 2 by 2 by 2 cube to be moved to time level L=1 as shown in FIG. 7B The work for one level is now done. The next level starts by loading the next growing faces from the inputs and placing them around the 2 by 2 by 2 cube that was generated from the previous level. This generates a 6 by 6 by 6 partition at time level L=1 as shown FIG. 7C. Stencil operations are performed to the inner 4 by 4 by 4 cube to move it time level L=2 as illustrated in FIG. 7D. Processing proceeds through next levels in a similar way, the algorithm ends with a cube of size 8 by 8 by 8 at time level L=4. FIGS. 7E through 7H illustrate schematically the results of growing a Swept 3D cube according to the present invention.

Connecting the Space-Time Components of Swept 3D

After formation of the Swept 3D space-time components, here we illustrate how these components work with each other to build the Swept Rule in 3D. From the formation examples described in connection with FIGS. 4A through 7H, it can be perceived that each grid point involved in the computational processing is surrounded by a complete set of immediate neighbors. These neighbors represent a 27-point 3D stencil in a 3D numerical discretization scheme.

An example takes the form of a cubic computational domain, with triply-periodic boundary conditions, that can be decomposed into 8 cubic-subdomains of equal sizes. Each of these subdomains is assigned to a different processor. As each processor starts to explicitly solve the PDE, following the domain of influence the domains of dependency to progress without the need to communicate with neighboring processes, each processor is building a shrinking cube. The result of this step is 3 pairs of shrinking faces as illustrated schematically in FIG. 4J.

The next stage in Swept 3D is to build the Longitudinal, Latitudinal, and Altitudinal beams. But before building the beams, data exchange between the parallel processors is required. In order to proceed from stage 1 to stage 2, which involves building the beams, each process needs to send data to three of its neighbors and receive data from its other three neighbors. To be more specific, each process exchanges three shrinking faces from the shrinking cube that it built in stage 1. Each shrinking cube has six shrinking faces and those faces are designated as North, South, East, West, Top, and Bottom. It is to be noted that in order to build a Latitudinal beam, each process needs a set of North and South shrinking faces. On the other hand, to build a Longitudinal beam, each process needs a set of East and West shrinking faces. And for an Altitudinal beam, a set of Top and Bottom faces is needed. For this reason, each process communicates its North, West, and Top shrinking faces to its North, West, and Top neighbors respectively. Each process also receives South, East, and Bottom shrinking faces from its South, East, and Bottom neighbors respectively. After this data exchange, each process has what it needs to build 3 beams, which completes stage 2 of Swept 3D.

Proceeding to stage 3 of Swept 3D in which the Swept 3D cores are built. As the output of each Swept 3D stage feeds into the next stage as input, a second data exchange between processors is needed to start stage 3 of Swept 3D. Referring back to Swept 3D beams in FIG. 5 and Tables 2, 3 and 4, it can be seen that building each beam results in the formation what are termed sides, which are four in number. And as each process built three beams, each process has 12 sides in total, where each two belong to one direction. To further clarify this, each process has a set of two North sides, a set of two South sides and so on for the remaining directions.

The communication is to exchange six sides with the neighboring processes. So each process communicates its two North, two West, and two Top sides to its North, West, and Top neighbors respectively. Each process also receives two South, two East, and two Bottom sides from its South, East, and Bottom neighbors respectively. After the data is properly exchanged, each process can proceed and build 3 cores.

The last stage of Swept 3D is to build the Swept 3D growing cube which needs six sets of growing faces. These growing faces are the result of building the Swept 3D cores in stage 3. So, a third communication between the processors is made to exchange between the processor nodes 104 the growing faces in order to processed with this last stage of Swept 3D. This time, each process communicates its North, West, and Top growing faces to its North, West, and Top neighbors respectively. Also, each processor node 104 receives South, East, and Bottom growing faces from its South, East, and Bottom neighbors, respectively. After the data is properly exchanged, each of the processor nodes 104 can build a growing cube.

At the end of this stage, the entire computational domain is at a consistent state. This means that all blocks, grid points or cells, are at the same time level. However, the domain arrangement has changed as a result a shift caused by the triply-periodic boundary condition assumed at the beginning. The foregoing represents what can be defined as a half Swept 3D cycle.

The other half of the Swept 3D cycle can be performed in the same way, except that the data exchange between the processor nodes 104 takes place between the other three neighbors. For example, instead of sending the North, West, and Top shrinking faces of the shrinking cube to North, West, and Top neighbors, the South, East, and Bottom shrinking faces of the shrinking cube are sent to the South, East, and Bottom neighbors. The same is applicable to the rest of Swept 3D components. At the end of the second half of the Swept 3D cycle, the domain has its original arrangement.

So, a complete Swept 3D processing cycle of steps 202 through 214 of the data processing system D, requires a total of six communications to take place. Three communications happen at each half of the Swept 3D cycle. It is to be noted that starting with an initial condition as time level 0, and working with cubic subdomains of 12 by 12 by 12, a complete Swept 3D cycle is allowed to promote the computational domain twelve time levels and yet involving only six communications between the processor nodes 104.

Program listings of instructions for building the Swept 3D components have been set forth above in Tables 1 through 8, respectively. Table 9 below represents the methodology, written in pseudo code, for connecting the Swept 3D components together and implement the Swept Rule in three-dimensional spatial coordinates. Table 9 indicates the requisite communication of results of the stencil operations performed to build each Swept 3D component. In the program listing of Table 9, the components that are exchanged between the processor nodes 104 are abbreviated by this first letter in the direction as a capital letter. Moreover, a ⊙→symbol is used to signify sending to a processor node 104, and a symbol →⊙ is used to signify receiving from a processor node 104.

Neighboring processes are symbolized with a "P" symbol and a subscript N, S, E, W, T and B indicating the direction of that process. For example, $P_N$ means the North neighboring process. So, in Table 9, a line that reads $N_P$ ⊙→$P_N$ [$N_P$], means sending the value of array $N_P$ to the North process, which should receive it in an array designated $N_P$.

TABLE 9

The Swept 3D (C) = Function Swept3D (St, $\mathcal{R}$, C)
Input: St: a list of stencil operations
   C: an n by n by n array representing a cubies subdomain
   $\mathcal{R}$: the number of Swept 3D cycles to perform
Output: C: The cubic subdomain partition after applying $\mathcal{R}$ *
n subtimesteps for c = 1,..., $\mathcal{R}$ do
| $N_P, S_P, \mathcal{E}_P, \mathcal{W}_P, \mathcal{T}_P, \mathcal{B}_P$ ← ShrinkingCube (St,C)
| $N_P$ ⊙→ $P_N[N_P]$; $\mathcal{W}_P$ ⊙→ $P_W[\mathcal{W}_P]$; $\mathcal{T}_P$ ⊙→ $P_T[\mathcal{T}_P]$
| $N_P$ ←⊙ $P_S[N_P]$; $\mathcal{W}_P$ ←⊙ $P_E[\mathcal{W}_P]$; $\mathcal{T}_P$ ←⊙ $P_B[\mathcal{T}_P]$
| $N_S, S_S, \mathcal{T}_S, \mathcal{B}_S$ ← LatiduinalBeam (St, $\mathcal{W}_P, \mathcal{E}_P$)
| $\mathcal{E}_t, \mathcal{W}_t, \mathcal{T}_t, \mathcal{B}_t$ ← LongitudinalBeam (St, $S_P, N_P$)
| $N_t, S_t, \mathcal{E}_t, \mathcal{W}_t$ ← AltitudinalBeam (St, $\mathcal{B}_P, \mathcal{T}_P$)
| $N_t, N_t$ ⊙→ $P_N[N_1, N_2]$; $\mathcal{W}_1, \mathcal{W}_2$ ⊙→ $P_W[\mathcal{W}_1, \mathcal{W}_2]$; $\mathcal{T}_1, \mathcal{T}_2$ ⊙→ $P_T[\mathcal{T}_2, \mathcal{T}_t]$
| $N_t, N_t$ ←⊙ $P_S[N_1, N_2]$; $\mathcal{W}_1, \mathcal{W}_2$ ←⊙ $P_M[\mathcal{W}_1, \mathcal{W}_2]$; $\mathcal{T}_1, \mathcal{T}_2$ ←⊙ $P_N[\mathcal{T}_2, \mathcal{T}_t]$
| ($\mathcal{E}_C, \mathcal{W}_C$) ← LatudidinalCore (St. $S_1, N_2, \mathcal{B}, \mathcal{T}_t$)
| ($N_C, S_C$) ← LongitudinalCore (St. $\mathcal{W}_t, \mathcal{E}_t, \mathcal{B}_t, \mathcal{T}_t$)
| ($\mathcal{T}_C, \mathcal{B}_C$) ← AltitudinalCore (St, $S_t, N_t, \mathcal{W}_t, \varepsilon_t$)
| $N_C$ ⊙→ $P_N[N_C]$; $\mathcal{W}_C$ ⊙→ $P_W[\mathcal{W}_C]$; $\mathcal{T}_C$ ⊙→ $P_N[\mathcal{T}_C]$
| $N_C$ ←⊙ $P_S[N_C]$; $\mathcal{W}_C$ ←⊙ $P_W[\mathcal{W}_C]$; $\mathcal{T}_C$ ←⊙ $P_W[\mathcal{T}_C]$
| (C) ← GrowingCube ($S_t, S_C, N_C, \mathcal{W}_C, \mathcal{W}_C, \mathcal{B}_C, \mathcal{T}_C$)
| $N_P, S_P, \mathcal{E}_P, \mathcal{W}_P, \mathcal{T}_P, \mathcal{B}_P$ ← ShrinkingCube (St, C)
| $S_P$ ⊙→ $P_S[S_P]$; $\mathcal{E}_P$ ⊙→ $P_W[\mathcal{E}_P]$; $\mathcal{B}_P$ ⊙→ $P_B[\mathcal{B}_P]$
| $S_P$ ←⊙ $P_N[S_P]$; $\mathcal{E}_P$ ←⊙ $P_W[\mathcal{E}_P]$; $\mathcal{B}_P$ ←⊙ $P_T[\mathcal{B}_P]$
| $N_S, S_S, \mathcal{T}_S, \mathcal{B}_S$ ← LatitudinalBeam (St, $\mathcal{W}_P, \mathcal{E}_P$)
| $\mathcal{E}_t, \mathcal{W}_t, \mathcal{T}_t, \mathcal{B}_t$ ← LongitudinalBeam (St, $S_P, N_P$)
| $N_t, S_t, \mathcal{E}_t, \mathcal{W}_t$ ← AltitudinalBeam (St, $\mathcal{B}_P, \mathcal{T}_P$)
| $S_1, S_2$ ⊙→ $P_S[S_1, S_2]$: $\mathcal{E}_1, \mathcal{E}_2$ ⊙→ $P_S[\mathcal{E}_1, \mathcal{E}_2]$: $\mathcal{B}_1, \mathcal{B}_2$ ⊙→ $P_B[\mathcal{B}_1, \mathcal{B}_2]$
| $S_1, S_2$ ←⊙ $P_N[S_1, S_2]$ $\mathcal{E}_1, \mathcal{E}_2$ ←⊙ $P_W[\mathcal{E}_1, \mathcal{E}_2]$: $\mathcal{B}_1, \mathcal{B}_2$ ←⊙ $P_T[\mathcal{B}_1, \mathcal{B}_2]$
| ($\mathcal{E}_C, \mathcal{W}_C$) ← LatitudinalCore (St. $S_1, N_2, \mathcal{B}, \mathcal{T}_t$)
| ($N_C, S_C$) ← LongitudinalCore (St. $\mathcal{W}_t, \mathcal{E}_t, \mathcal{B}_t, \mathcal{T}_t$)
| ($\mathcal{T}_C, \mathcal{B}_C$) ← AltitudinalCore (St, $S_t, N_t, \mathcal{W}_t, \varepsilon_t$)
| $S_C$ ⊙→ $P_S[S_C]$: $\mathcal{E}_C$ ⊙→ $P_S[\mathcal{E}_C]$: $\mathcal{B}_C$ ⊙→ $P_H[\mathcal{B}_C]$
| $S_C$ ←⊙ $P_N[S_C]$: $\mathcal{E}_C$ ←⊙ $P_W[\mathcal{E}_C]$: $\mathcal{B}_C$ ←⊙ $P_T[\mathcal{B}_C]$
| (C) ← GrowingCube (St, $S_C, N_C, \mathcal{W}_C, \mathcal{W}_C, \mathcal{B}_C, \mathcal{T}_C$)
end After the data processing system D performs the desired number of Swept 3D cycles, it provides during step 220 the results of the numerical simulation, whether of a partial differential equation or other complex numerical simulation, through graphical display 110 of user interface 108 for inspection, study and analysis.

Verifying the Swept Rule in 3D—Solution of the 3D Heat Equation

To verify the Swept 3D algorithms and confirm that the implementation is correct, the implementation has been tested by solving the three-dimensional heat diffusion equation. The PDE configuration for three-dimensional heat diffusion into a three-dimensional volume with periodic boundary conditions and an initial heat source 800A located at the center of the domain. The verification of the solution is shown in FIGS. 8A through 8F. FIGS. 8A through 8F are example displays as solution of heat diffusion equation from the heat source 800A at a center point of each such Figure. The expected behavior is for the heat to diffuse from the position and state as the simulation of the heat diffusion into three-dimensional space advances in time.

FIGS. 8A through 8F represent the heat by color in logarithmic scale according to a color code key 802 in a three-dimensional x, y, and z spatial grid 804. The heat at particular three-dimensional x, y, z coordinates of the grid

Figure 8A:
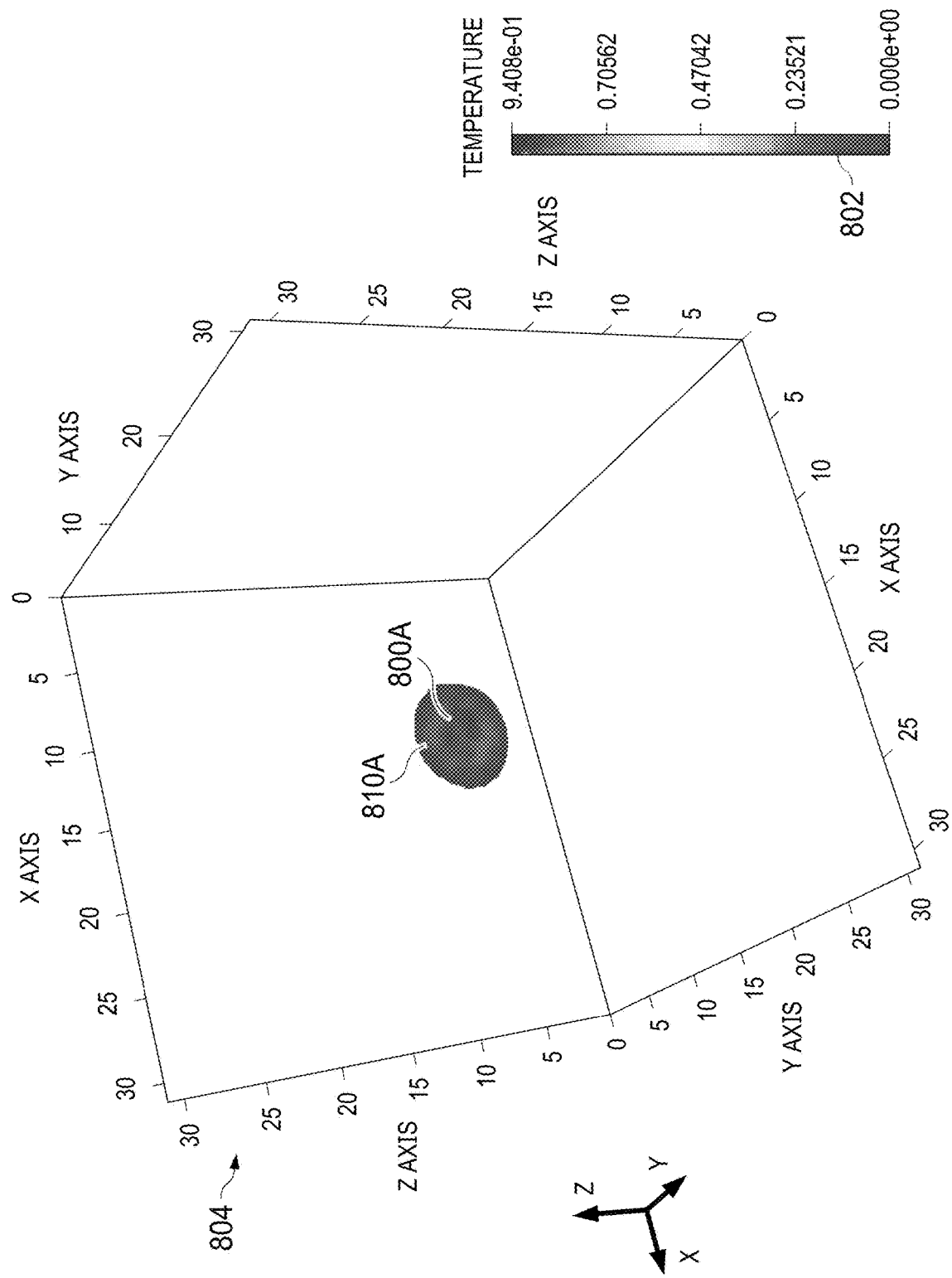
FIGS. 8A, 8B, 8C, 8D, 8E and 8F are example displays of output results of operation of the data processing system of FIG. 1.
Figure 8B:
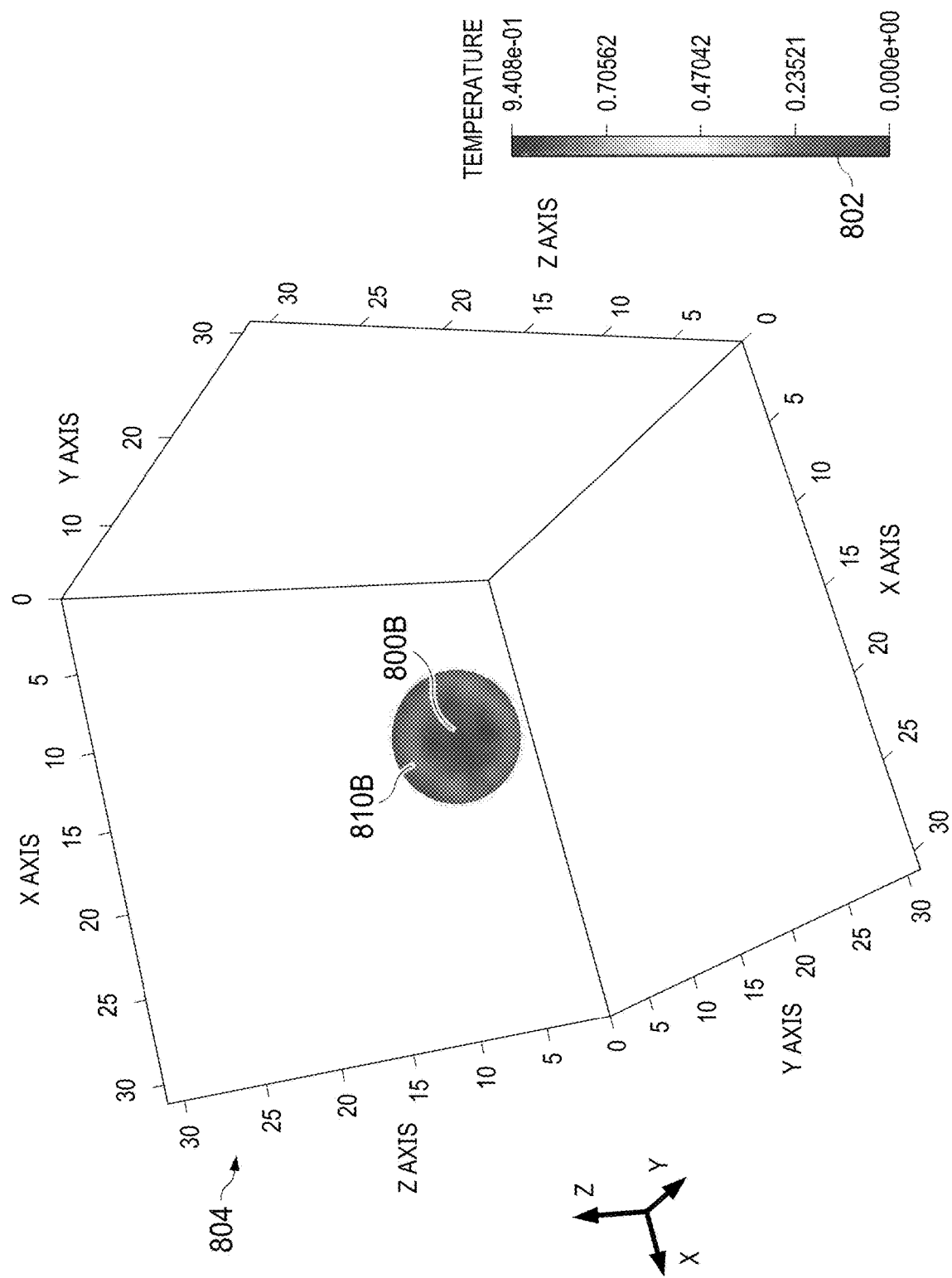
Figure 8C:
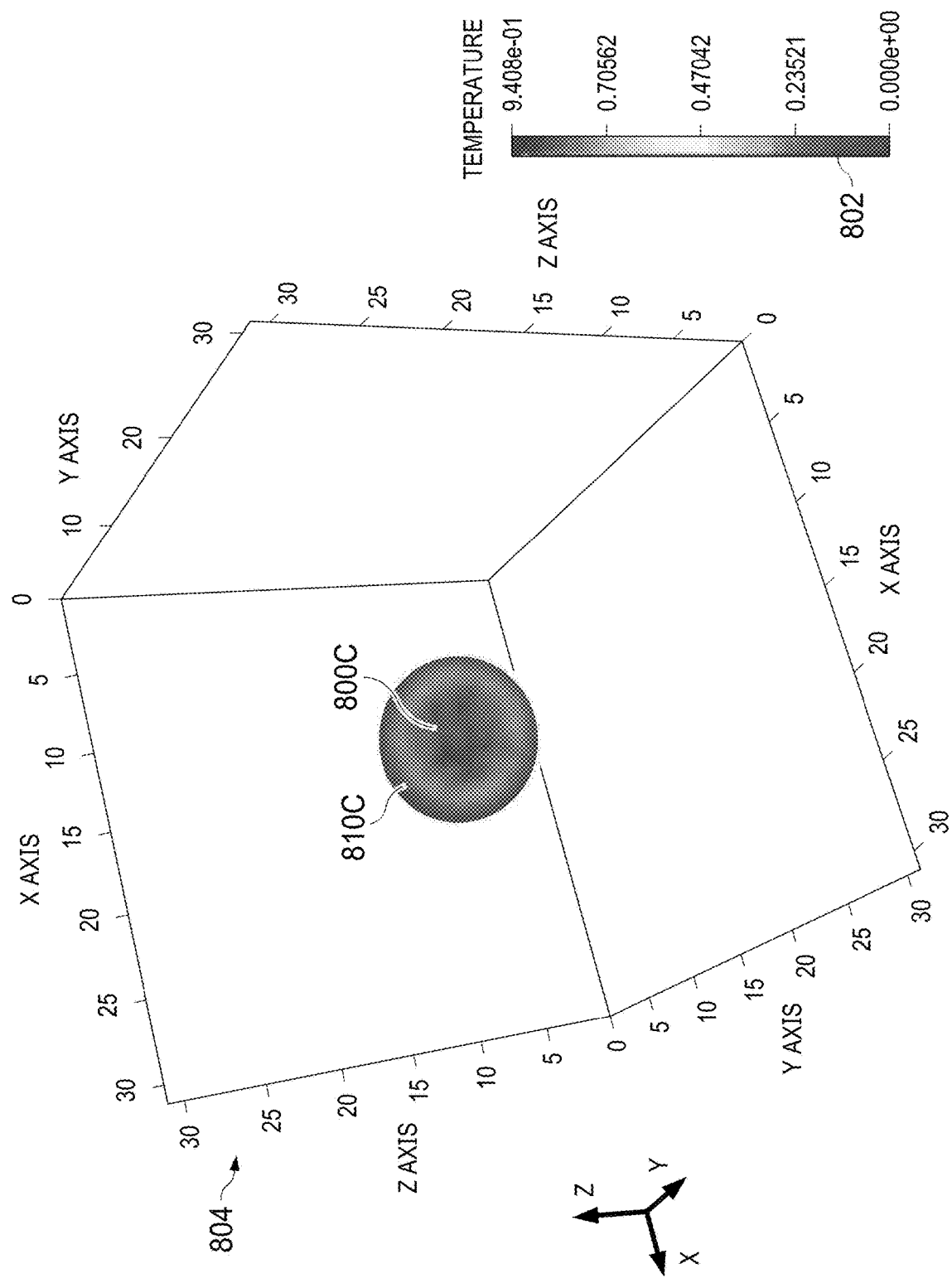
Figure 8D:
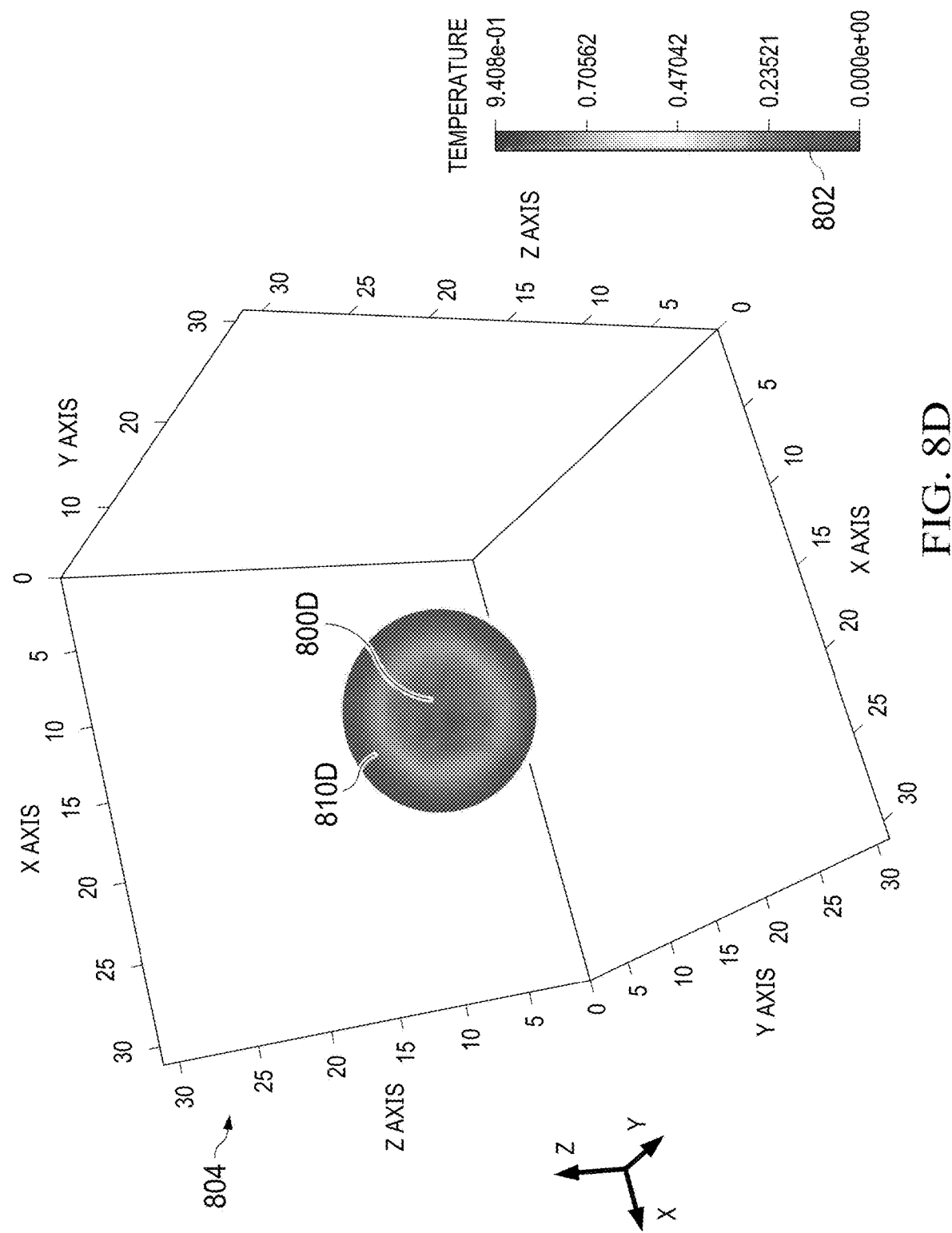
Figure 8E:
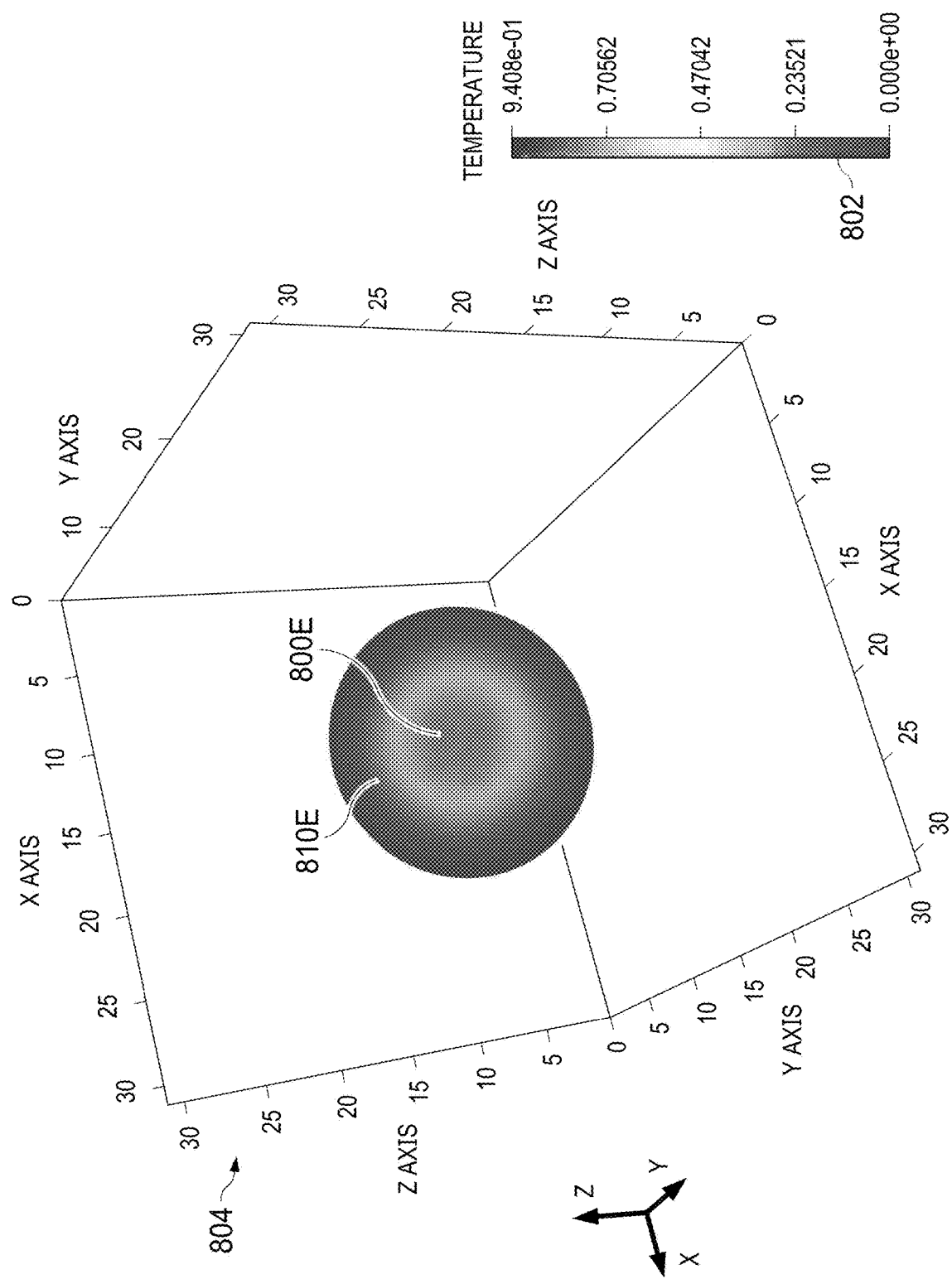
Figure 8F:
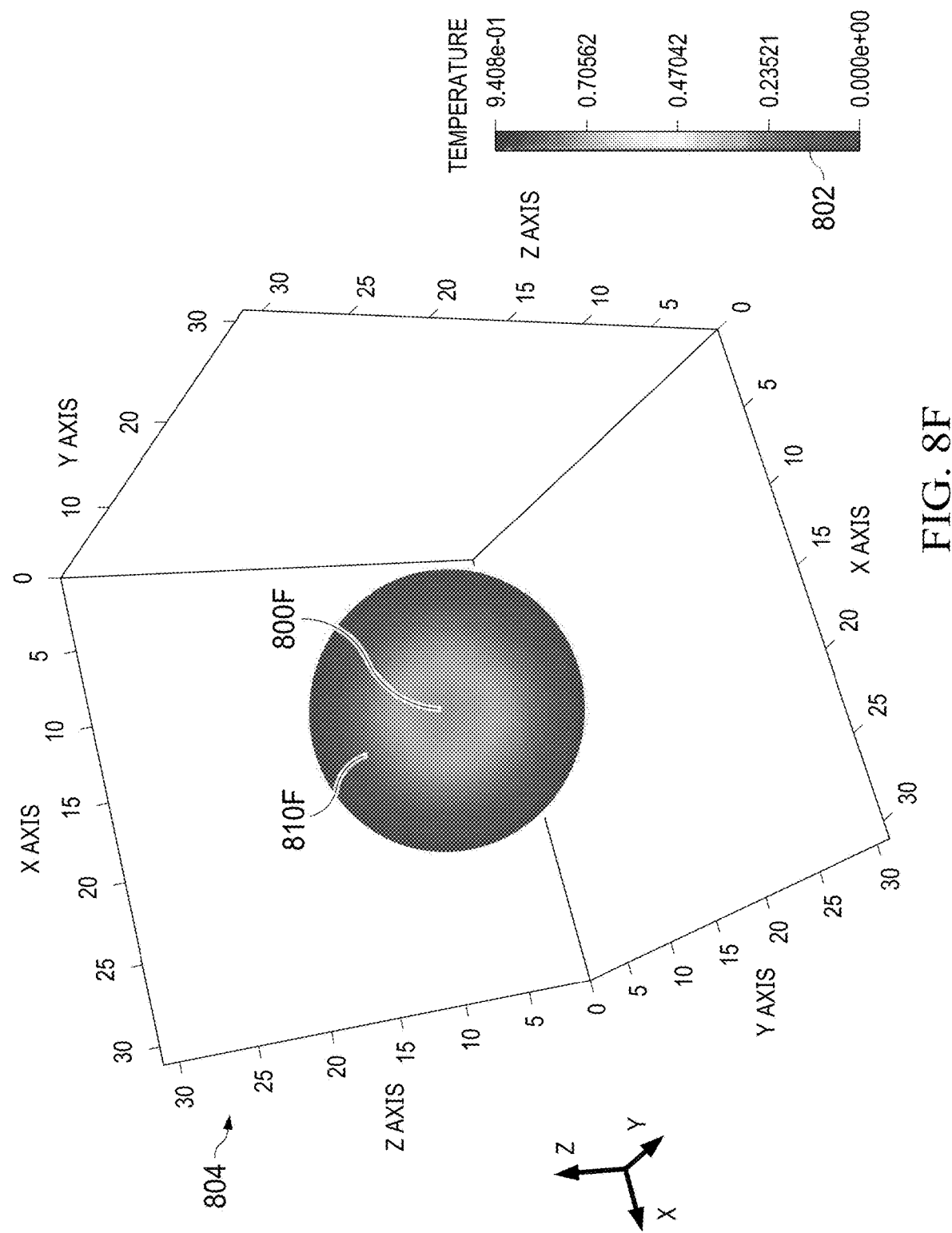

804 as diffusion occurs is determined and displayed at the indicated by a color according to the temperature color key 802. FIG. 8A shows the heat source 800A at an example beginning state of heat diffusion. The heat is confined in a relatively compact volume as indicated at 800A, with only an outer fringe 810A of a relatively low temperature. In successive ones of the FIGS. 8B through 8F, the volume of three-dimensional space actually heated expands outwardly from the original position and state shown in FIG. 8A in three-dimensional space over time, while also decreasing in temperature as indicated by the colors according to the color key 802. As also indicated at 800B, 800C, 800D, 800E, and 800F of FIGS. 8B through 8F, respectively, the heat expands outwardly by diffusion into three-dimensional space into a greater volume as time elapses. As also shown in FIGS. 800B through 800F, temperature decreases in the area bound by outer fringe regions 810B, 810C, 810D, 810E, and 810F, respectively, as indicated by the colors according to the color key 802.

FIGS. 8A through 8F of the displays are sequential displays of the state of the domain as the solution of the heat diffusion partial diffusion equation or PDE advances in time. FIGS. 8A through 8F show that is the implementation is correct. This example for parallel network processing according to the present invention was run in eight processes, meaning that, different computer processor nodes 104 processed only part of the domain, and the master node 100 combined the results from the processor nodes provided the processing results, the correct solution for the was obtained. Thus communication between each of the subdomains required for solution of the heat diffusion partial diffusion equation was correct. The results verified that the flow of the data between the different components of the data processing system D and its master node(s) 100 and parallel operating computing processor cores 104 involved in the simulation is correct.

The experiment was conducted in a cubic domain of size 32 by 32 by 32 which was decomposed into eight subdomains using eight MPI processes each containing a 16 by 16 by 16 cube. The whole purpose behind this run was to verify the design of the Swept 3D algorithms and confirm that the communication between the Swept 3D components is correct. The behavior of the heat diffusion in the obtained solution certifies the corrections of the design and implementation of Swept 3D.

The data processing system according to the present invention with reduced latency from Swept 3D functionality as is integrated into a practical application and deals with problems of a technical character. In the test implementation described in connection with FIGS. 8A through 8F, heat diffusion through three dimensional co-ordinates over time in connection turbine blade design and manufacture is an illustrative example of such a practical application. The data processing system according to the present invention also solves technological problems by reducing latency in processing for reservoir simulation of fluid flow in three-dimensions over time in a hydrocarbon reservoir during production from the reservoir. The data processing system according to the present invention also solves technological problems by reducing latency in processing travel of mechanical wave energy through a three-dimensional subsurface region over time during seismic exploration.

The data processing system according to the present invention achieves this without incurring any redundant computation by decomposing space and time among computing nodes in ways that exploit the domains of influence and the domain of dependency, making it possible to communicate once per many time steps. By communicating less frequently, the swept rule breaks the latency barrier, advancing on average more than one time step per round-trip latency of the network.

The data processing system according to the present invention solves the technological problem of network latency barriers in data processing systems performing and numerical simulations by for decomposing space and time in solving numerical simulations, such as PDE's to three space-dimensional problems. The data processing system according to the present invention in solving these numerical simulations overcomes or breaks the latency barrier, advancing each processing time step in a fraction of the time required for a message to travel from one computing node to another.

The invention has been sufficiently described so that a person with average knowledge in the field of parallel processor computer systems may reproduce and obtain the results mentioned in the invention herein. Nonetheless, any skilled person in the field of technique, subject of the invention herein, may carry out modifications not described in the request herein, to apply these modifications to a determined structure and methodology, or in the use and practice thereof, requires the claimed matter in the following claims; such structures and processes shall be covered within the scope of the invention.

It should be noted and understood that there can be improvements and modifications made of the present invention described in detail above without departing from the spirit or scope of the invention as set forth in the accompanying claims.

What is claimed is:

1. A data processing system performing a numerical solution as a parallel processing network of measures of parameters of technological physical relationship present in three spatial dimensions of discretized grid data points as a function of time in a sequence of simulation time steps during which the technological physical relationship is occurring, the data processing system comprising a cluster computer network comprising at least one master node and a plurality of associated processor nodes, the data processing system performing the numerical simulation with reduced latency of communication of processing results of the simulation between the nodes during the sequence of simulation time steps, the data processing system comprising:
 (a) the at least one master node providing input data, initializing and time stepping parameters for the numerical simulation of a technological process, and input measures of the physical phenomena occurring in the technological process at a present time step in the sequence of time steps;
 (b) the at least one master node allocating among the plurality of processor nodes grid data points to be processed by the numerical simulation, the allocated grid data points representing the measures of parameters of technological physical relationship at the present time step;
 (c) the processor nodes performing the numerical simulation as a four dimensional computational domain of the allocated grid data points for the present time step by performing the steps of;
  (1) receiving the allocated grid data points from the master node;
  (2) processing the received allocated grid data points organizing the grid data by performing the steps of:
   (i) forming a three-dimensional shrinking cube of data points for external faces of the allocated grid data points by performing stencil operations on the allocated grid data points;

(ii) communicating the formed three-dimensional shrinking cube of data points to processor nodes allocated contiguous data points in the three dimensional spatial coordinates;

(iii) forming three-dimensional beams of data points for each of the three spatial dimensions of discretized grid data points by performing stencil operations on the allocated grid data points, the formed three-dimensional beams comprising a latitudinal beam, a longitudinal beam, and an altitudinal beam, wherein each beam of the formed three-dimensional beams connects the formed three-dimensional shrinking cube to an adjacent cube;

(iv) communicating the formed three-dimensional beams of data points to processor nodes allocated contiguous data points in the three dimensional spatial coordinates;

(v) forming three-dimensional cores of data points for each of the three spatial dimensions of discretized grid data points by performing stencil operations on the allocated grid data points, the formed three-dimensional cores comprising a latitudinal core, a longitudinal core, and an altitudinal core, wherein each core of the formed three-dimensional core represents a face of the formed three-dimensional shrinking cube;

(vi) communicating the formed three-dimensional cores of data points to processor nodes allocated contiguous data points in the three dimensional spatial coordinates; and (vii) forming a three-dimensional growing cube of data points for each of the three spatial dimensions of discretized grid data points by performing stencil operations on the allocated grid data points to form measures of parameters of technological physical relationship in the three spatial dimensions of the allocated grid data points at the present time step;

(d) the at least one master node further determining if the numerical simulation has been performed for each of the time steps of the sequence; and, if not, (1) incrementing the time step; and (2) returning to the steps of providing input data, initializing and time stepping parameters for the numerical simulation of the technological process, and input measures of the physical phenomena occurring in the technological process at the incremented time step in the sequence of time steps; and (3) the at least one master node allocating grid data points to be processed by the numerical simulation among the plurality of processor nodes; and (e) the plurality of processor nodes performing the numerical simulation as a four dimensional computational domain of the allocated grid data points for the incremented time step.

2. The data processing system of claim 1, wherein the at least one master node determines that each of the time steps of the sequence of the numerical simulation has been performed, and further including the step of storing the measures of parameters of technological physical relationship in the three spatial dimensions of the allocated grid data points for the sequence of time steps of the numerical simulation.

3. The data processing system of claim 1, wherein the at least one master node determines that each of the time steps of the sequence of the numerical simulation has been performed, and further including the step of forming an output display of the measures of parameters of technological physical relationship in the three spatial dimensions of the allocated grid data points for the sequence of time steps of the numerical simulation.

4. The data processing system of claim 1, wherein the technological physical relationship comprises heat diffusion over time through three-dimensional spatial coordinates.

5. The data processing system of claim 1, wherein the technological physical relationship comprises reservoir simulation of fluid conditions during hydrocarbon production over time from a subsurface hydrocarbon reservoir.

6. The data processing system of claim 1, wherein the technological physical relationship comprises propagation of an energy wave over time through three-dimensional spatial coordinates.

* * * * *